(12) United States Patent
Nakata et al.

(10) Patent No.: US 7,387,400 B2
(45) Date of Patent: Jun. 17, 2008

(54) LIGHT-EMITTING DEVICE WITH SPHERICAL PHOTOELECTRIC CONVERTING ELEMENT

(75) Inventors: Josuke Nakata, Kyoto (JP); Hiromi Sugimura, Hokkaido (JP); Hiroshi Endo, Hokkaido (JP)

(73) Assignee: Kyosemi Corporation, Kyoto (JP)

( * ) Notice: Subject to any disclaimer, the term of this patent is extended or adjusted under 35 U.S.C. 154(b) by 169 days.

(21) Appl. No.: 10/552,255

(22) PCT Filed: Apr. 2, 2004

(86) PCT No.: PCT/JP2004/005674

§ 371 (c)(1),
(2), (4) Date: Oct. 26, 2005

(87) PCT Pub. No.: WO2004/095590

PCT Pub. Date: Nov. 4, 2004

(65) Prior Publication Data

US 2006/0133073 A1 Jun. 22, 2006

(30) Foreign Application Priority Data

Apr. 21, 2003 (JP) .............................. 2003-115512

(51) Int. Cl.
*F21L 4/02* (2006.01)

(52) U.S. Cl. ........................ 362/192; 362/251; 362/252; 136/246; 136/250; 136/259

(58) Field of Classification Search ................. 362/192, 362/249, 251, 252, 802; 136/246, 251, 259; 250/372

See application file for complete search history.

(56) References Cited

U.S. PATENT DOCUMENTS

| | | | | |
|---|---|---|---|---|
| 3,025,335 A | * | 3/1962 | Ralph | .......................... 136/250 |
| 3,038,952 A | | 6/1962 | Ralph | |
| 3,350,775 A | | 11/1967 | Iles | |
| 3,433,676 A | | 3/1969 | Stein | |
| 3,844,840 A | * | 10/1974 | Bender | ........................ 136/251 |
| 3,998,659 A | | 12/1976 | Wakefield | |
| 4,021,323 A | | 5/1977 | Kilby et al. | |
| 4,126,812 A | | 11/1978 | Wakefield | |

(Continued)

FOREIGN PATENT DOCUMENTS

EP 0 866 506 9/1998

(Continued)

OTHER PUBLICATIONS

U.S. Appl. No. 10/169,017, Nakata.

*Primary Examiner*—Ismael Negron
(74) *Attorney, Agent, or Firm*—Jordan and Hamburg LLP

(57) ABSTRACT

A light-emitting device has spherical photo-electric converting elements that have a substantially spherical acceptance surface, respectively; a light emitting diode powered by the spherical photo-electric converting elements; a control circuit; and a sealing member that integrates the spherical photo-electric converting elements, the light emitting diode and the control circuit. The control circuit is equipped with a light emitting control circuit including a photo-detecting sensor, a charge control circuit and a condenser.

11 Claims, 10 Drawing Sheets

U.S. PATENT DOCUMENTS

| | | | |
|---|---|---|---|
| 4,224,081 A | 9/1980 | Kawamura et al. | |
| 4,229,733 A * | 10/1980 | Tulenko et al. | 250/372 |
| 4,343,032 A * | 8/1982 | Schwartz | 362/276 |
| 4,581,103 A | 4/1986 | Levine et al. | |
| 4,582,588 A | 4/1986 | Jensen et al. | |
| 4,583,588 A | 4/1986 | Franzolini et al. | |
| 4,691,076 A | 9/1987 | Levine et al. | |
| 4,704,535 A * | 11/1987 | Leber et al. | 250/372 |
| 4,851,686 A * | 7/1989 | Pearson | 250/372 |
| 4,985,632 A * | 1/1991 | Bianco et al. | 250/372 |
| 5,028,546 A | 7/1991 | Hotchkiss | |
| 5,036,443 A * | 7/1991 | Humble et al. | 362/183 |
| 5,231,781 A * | 8/1993 | Dunbar | 136/291 |
| 5,382,986 A * | 1/1995 | Black et al. | 250/372 |
| 5,419,782 A * | 5/1995 | Levine et al. | 136/246 |
| 5,428,249 A | 6/1995 | Sawayama et al. | |
| 5,431,127 A | 7/1995 | Stevens | |
| 5,453,729 A * | 9/1995 | Chu | 362/183 |
| 5,469,020 A | 11/1995 | Herrick | |
| 5,498,576 A | 3/1996 | Hotchkiss et al. | |
| 5,538,902 A | 7/1996 | Izu et al. | |
| 5,680,033 A * | 10/1997 | Cha | 136/251 |
| 5,782,552 A * | 7/1998 | Green et al. | 362/183 |
| 5,793,184 A * | 8/1998 | O'Connor | 136/251 |
| 6,204,545 B1 | 3/2001 | Nakata | |
| 6,265,242 B1 | 7/2001 | Komori et al. | |
| 6,294,822 B1 | 9/2001 | Nakata | |
| 6,355,873 B1 | 3/2002 | Ishikawa | |
| 6,402,338 B1 * | 6/2002 | Mitzel et al. | 362/154 |
| 6,563,041 B2 * | 5/2003 | Sugawara et al. | 136/246 |
| 6,744,073 B1 | 6/2004 | Nakata | |
| 7,044,616 B2 * | 5/2006 | Shih | 362/135 |
| 7,109,528 B2 | 9/2006 | Nakata | |
| 2004/0238833 A1* | 12/2004 | Nakata | 257/88 |
| 2005/0067622 A1 | 3/2005 | Nakata | |
| 2005/0127379 A1 | 6/2005 | Nakata | |
| 2006/0043390 A1 | 3/2006 | Nakata | |
| 2006/0086384 A1 | 4/2006 | Nakata | |
| 2006/0133073 A1 | 6/2006 | Nakata et al. | |
| 2006/0169992 A1 | 8/2006 | Nakata | |

FOREIGN PATENT DOCUMENTS

| | | |
|---|---|---|
| EP | 0 982 780 | 3/2000 |
| EP | 1 255 303 | 11/2002 |
| GB | 1195547 | 6/1970 |
| JP | 1-179374 | 7/1989 |
| JP | 5-36997 | 2/1993 |
| JP | 6-013633 | 1/1994 |
| JP | 8-199513 | 8/1996 |
| JP | 9-49213 | 2/1997 |
| JP | 9-162434 | 6/1997 |
| JP | 09-162434 | 6/1997 |
| JP | 10-33969 | 2/1998 |
| JP | 2000-22184 | 1/2000 |
| JP | 2000-259992 | 9/2000 |
| JP | 2001-102618 | 4/2001 |
| JP | 2001-119093 | 4/2001 |
| JP | 2001-156315 | 6/2001 |
| JP | 2001-168369 | 6/2001 |
| JP | 2001-177132 | 6/2001 |
| JP | 2001-210834 | 8/2001 |
| JP | 2001-210848 | 8/2001 |
| JP | 2001-267609 | 9/2001 |
| JP | 2002-50780 | 2/2002 |
| JP | 2002-164554 | 6/2002 |
| WO | WO-98/36461 | 8/1998 |
| WO | WO-03/017383 | 2/2003 |

\* cited by examiner

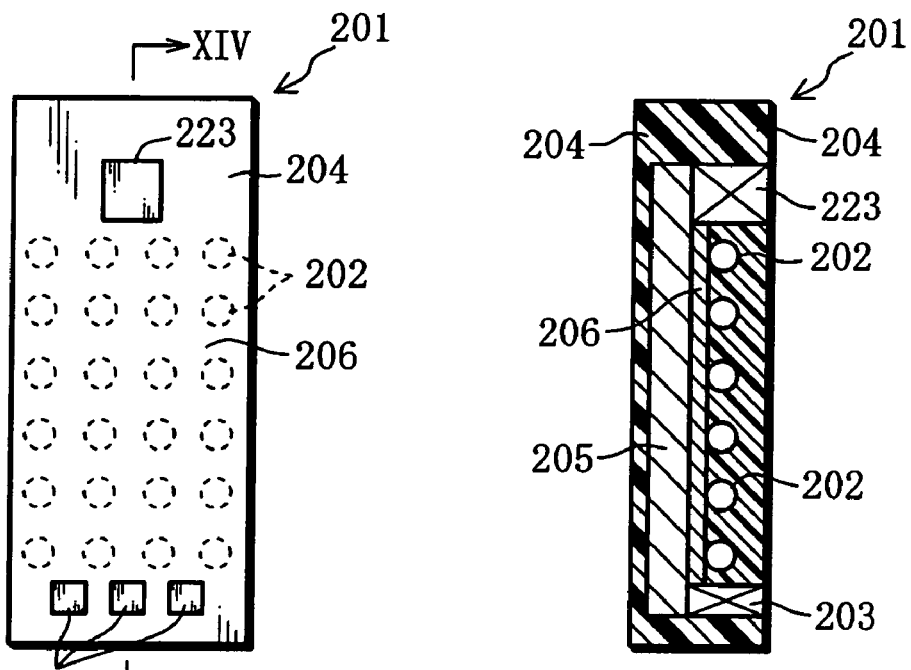
Fig. 13
Fig. 14
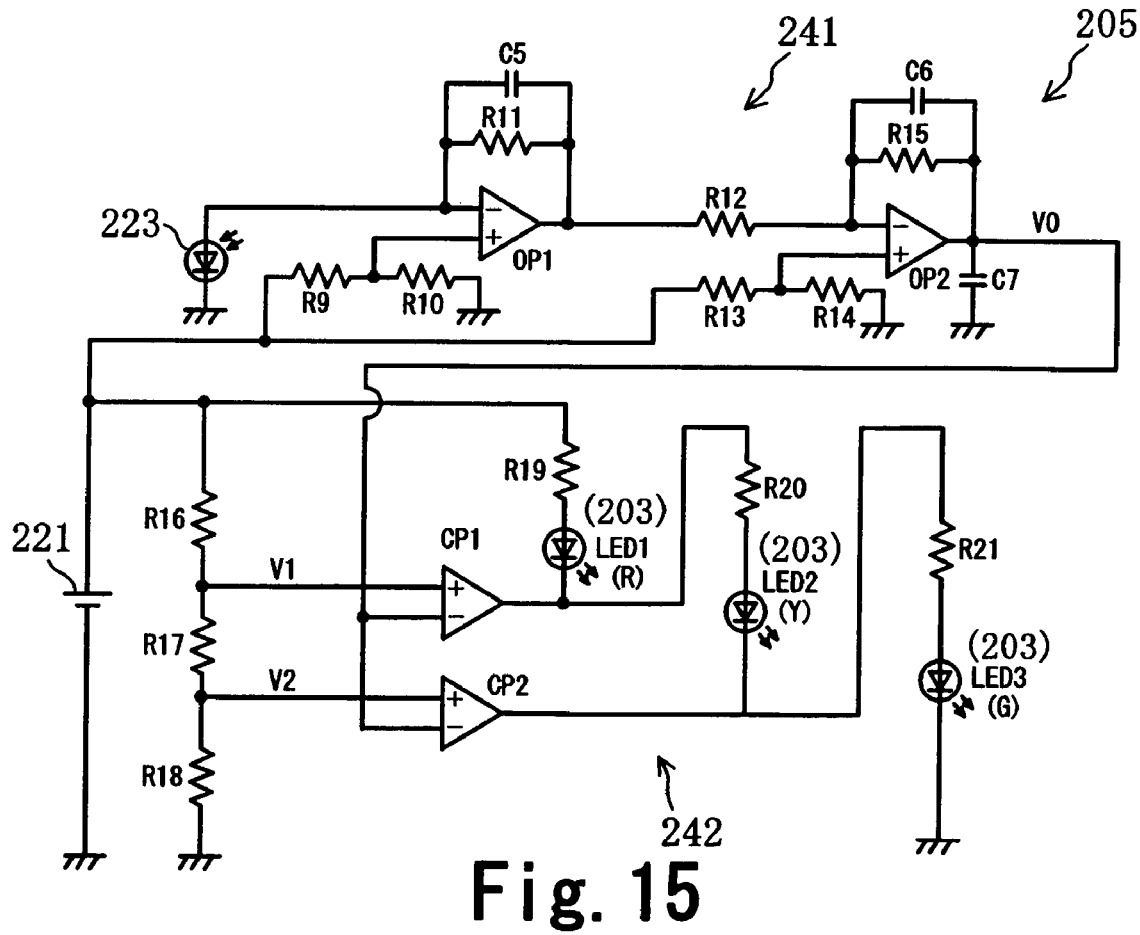
Fig. 15

LIGHT-EMITTING DEVICE WITH SPHERICAL PHOTOELECTRIC CONVERTING ELEMENT

TECHNICAL FIELD

The present invention relates to a self light-emitting device that allows one or more luminous bodies to emit light using electric power generated by a photo-electric converting element.

BACKGROUND OF THE RELATED ART

Conventionally, various self light-emitting devices, which allow one or more luminous bodies to emit light using electric power generated by a photo-electric converting element, such as a solar battery, have been proposed. For example, in the publication of Japanese Laid-Open Patent Application Hei 9-49213, a road installation type signaling device equipped with a flat solar battery, multiple light emitting diodes arranged around the solar battery and a storage cell where electric power generated by the solar battery is accumulated is proposed. In this signaling device, the entire device is buried and installed in the road, and the electric power generated by the solar battery is accumulated in the storage cell during the day, and the light emitting diodes blink due to the electric power accumulated in the storage cell during the night.

In Japanese Laid-Open Patent Application Hei 8-199513, a light emitting indicator equipped with a flat solar battery, plural light emitting diodes, a storage cell and an electric circuit, and in which these constructional elements are buried into transparent epoxy resin, is proposed. Even in this light emitting indicator, the electric power generated by the solar battery is accumulated in the storage cell during the day, and the light emitting diodes blinks using the electric power during the night. Burying the construction elements into the epoxy resin results in improved weather resistance.

However, in the devices described in Japanese Laid-Open Patent Application Hei 9-49213 and Japanese Laid-Open Patent Application Hei 8-199513, since electric power is generated by a flat solar battery, high power electricity cannot be always generated during the day, but the high power electricity can be generated only for several hours when the sunlight enters almost vertically into the solar battery at a small angle of incidence. In other words, since the electric power required at night has to be accumulated during several hours, the light receiving area of the solar battery has to be large, with the problem that the device becomes excessively large.

When installing the devices described in Japanese Laid-Open Patent Application Hei 9-49213 and Japanese Laid-Open Patent Application Hei 8-199513 on a flat road, electric power can be accumulated in the storage cell. However, if the devices are installed on a slope, such as a slope formed on an inclined plane on the north side, since a great deal of sunlight is reflected on the surface of the solar battery, the desired electric power cannot be accumulated in the storage cell and the light emitting diodes cannot emit light during the night, making it difficult for drivers in vehicles traveling on the road to drive safely.

In recent years, a low cost, small and light weight self light-emitting device used for the purpose of safety at night by attaching it to a bicycle, a bag or a cap has been desired. When attaching these devices, a self light-emitting device is often installed close to a vertical state, and the electric power, which is supposed to accumulate in the storage cell cannot be generated because the sunlight enters almost parallel to the acceptance surface, making it impossible to practically use.

The objective of the present invention is to provide a self light-emitting device, where electric power to be generated is not affected by the installation location, and which can be manufactured at a low cost and is small and light weight.

SUMMARY OF THE INVENTION

The self light-emitting device of the present invention is characterized by comprising a spherical photo-electric converting element having a substantially spherical light receiving surface; a lens member that guides or condenses light to the spherical photo-electric converting element; a luminous body that emits light using electric power generated by the spherical photo-electric converting element; and a sealing member embedding above described whole elements integrally. In this self light-emitting device, when incidental light enters into the self light-emitting device, the incidental light is guided or condensed by the lens member; the incidental light is received on the substantially spherical light receiving surface of the spherical photo-electric converting element, electric power is generated; and the luminous body emits light using the electric power. In this self light-emitting device, since the light receiving surface of the spherical photo-electric converting element is formed to be substantially spherical, electric power can be generated on average as long as incidental light enters without depending upon the angle of the incidental light. Therefore, with an outside installation, electric power can be generated on average during the day regardless of the angle of incidence of the sunlight. In addition, when constructed to accumulate the generated electricity in a storage cell, sufficient electric power can be accumulated in the storage cell during the day regardless of the position of sun for several hours as long as the weather is fine.

Even when attaching the device to a bicycle, a bag or a cap, sufficient electric power can be always generated without being affected by the attached angle, so a luminous body can be emit the light. Since incidental light is guided or condensed by the lens member, even if the light receiving area of the spherical photo-electric converting element is small, strong incidental light is received on the light receiving surface, so miniaturization and light weight of the photo-electric converting element can be realized. On the same time, the miniaturization and light weight of the self light-emitting device can be realized. Since the entire device is embedded integrally in the sealing member, any damage of the spherical photo-electric converting element or the luminous body due to rain can be prevented. Further, since inexpensive material can be used for each constitutional element, production cost can be reduced.

Herein, the following constitution may be appropriately adopted:

1) As the photo-electric converting element, multiple series-connected spherical photo-electric converting elements are applicable.

2) A condenser for accumulating electric power generated by the spherical photo-electric converting element is provided.

3) A light emitting control circuit for controlling a conduction of electric power to the luminous body is provided.

4) A photo-detecting sensor is incorporated into the light emitting control circuit.

5) The light emitting control circuit comprises an astable multivibrator including two transistors and multiple resistances.

6) A charge control circuit for controling charging to the condenser is provided.

7) The lens member and the sealing member are formed with the same type of synthetic resin material.

8) A partial spherical metallic reflection member for reflecting incident light to the lower surface side of each of the spherical photo-electric converting elements.

9) The reflection member may be made from a lead frame.

10) The photo-detecting sensor is made from an ultraviolet sensor, and a direct-current amplifying circuit to amplify a voltage according to the intensity of ultraviolet rays detected by the ultraviolet sensor and transmits the amplified voltage, and is provided in the light emitting control circuit.

11) A plurality of luminous bodies are provided, and the light emitting control circuit allows any of the luminous bodies to emit light based on the output from the ultraviolet sensor.

12) A schmitt trigger inverter and resistors are incorporated in the light emitting control circuit in parallel for making the luminous body blink.

13) The condenser is a manganese dioxide-lithium secondary battery.

14) A reflection member formed with a light reflectible transparent resin is provided adjacent to the spherical photo-electric converting elements and the luminous body.

15) The photo-detecting sensor is formed with cadmium sulfide (CdS).

BRIEF DESCRIPTION OF THE DRAWINGS

FIG. 13 is a plane view of an ultraviolet monitoring device of the third embodiment.

FIG. 14 is a cross-sectional view along XIV-XIV line in FIG. 13.

FIG. 15 is a circuit diagram of a light emitting control circuit of the ultraviolet monitoring device in FIG. 13.

DETAILED DESCRIPTION OF PREFERRED EMBODIMENTS

Embodiment 1 (Refer to FIG. 1 through FIG. 7)

Embodiment 1 of the present invention are described hereafter, with reference to the drawings. The present embodiment is an example where the present invention is applied to a mobile self light-emitting device, where a light emitting diode blinks only in the state where light is low, such as at night.

Figure 1:
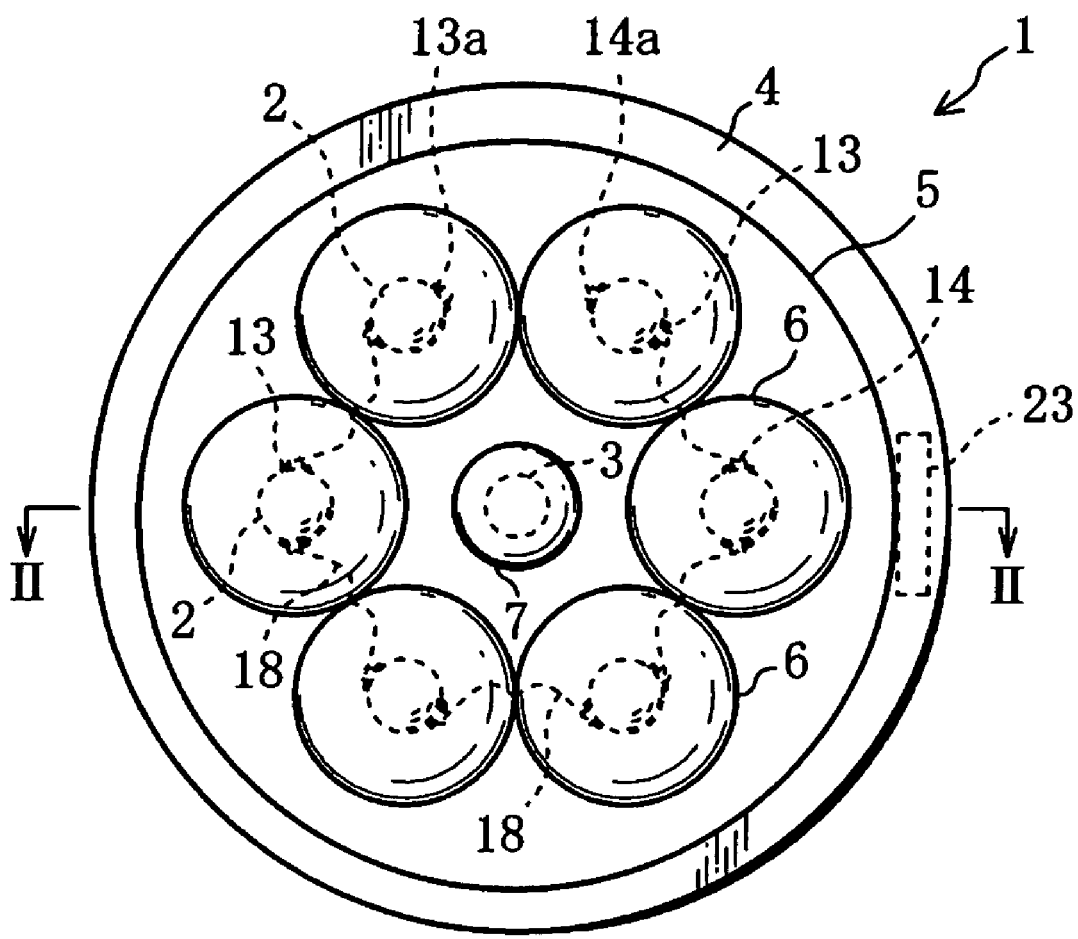
FIG. 1 is a plane view of the self light-emitting device of the first embodiment of the present invention.
Figure 2:
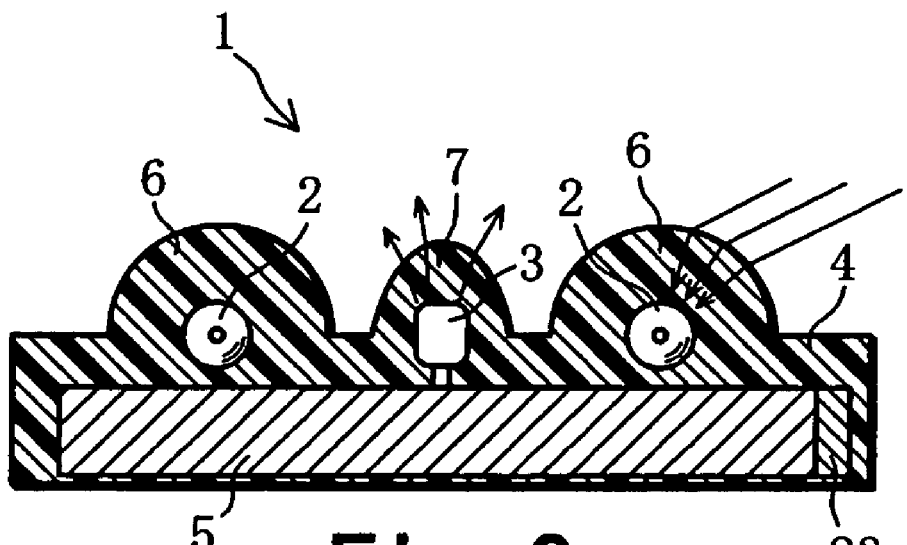
FIG. 2 is a cross-sectional view along II-II line in FIG. 1.

As shown in FIG. 1 and FIG. 2, a self light-emitting device 1 is equipped with six spherical photo-electric converting elements 2, a light emitting diode 3, a sealing member 4 and a control circuit 5.

Figure 3:
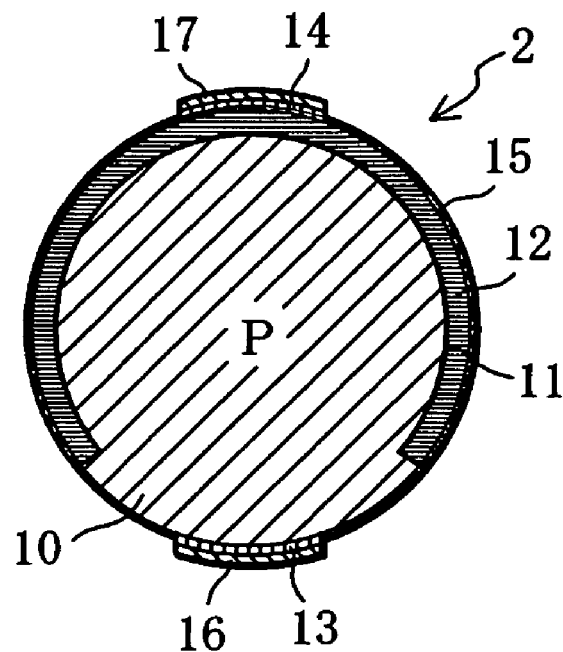
FIG. 3 is a cross-sectional view of a spherical photo-electric converting element.

The spherical photo-electric converting elements 2 are similar to those described in detail in Japanese Laid-Open Patent Application 2001-168369, and is briefly described here. As shown in FIG. 3, the spherical photo-electric converting element 2 is equipped with a spherical crystal 10 made from a p-type silicon semiconductor, the diameter of which is approximately 1.5 mm and resistivity is approximately 1 Ω cm; an n-type diffusion layer 12 formed in the vicinity of the surface of the spherical crystal 10 for the purpose of forming a substantially spherical pn-joint 11; a positive electrode 13 electrically connected to the p-type silicon of the spherical crystal 10; a negative electrode 14 formed at a position point-symmetrically facing the positive-electrode 13 relative to the center of the spherical crystal 10, and electrically connected to the n-type diffusion layer 12; and an insulation film 15 formed on the surface of the spherical crystal 10 at sections where the electrodes 13, 14 are not formed. In addition, an Al paste film 16 with approximately 20 μm of thickness is coated on the surface of the positive electrode 13, and an Ag paste film 17 with approximately 20 μm of thickness is coated on the surface of the negative electrode 14. When light, such as sunlight, enters into the spherical photo-electric converting elements 2, the incidental light transmits through the n-type diffusion layer 12 and enters the pn-joint 11, and a photo-electromotive force is generated on the pn-joint 11. The photo-electromotive force of these spherical photo-electric converting elements 2 is approximately 0.6 V, and approximately 3-3.5 mA of electric current can be discharged.

As shown in FIGS. 1 and 2, six spherical photo-electric converting elements 2 are arranged around the light emitting diode 3 at approximately 60° of intervals. The positive electrode 13 of each spherical photo-electric converting element 2 is electrically connected to the negative electrode 14 of the adjacent spherical photo-electric converting element 2 by a copper line 18, respectively, and the six spherical photo-electric converting elements 2 are connected with each other in series. However, a positive electrode 13a and a negative electrode 14a, equivalent to both ends of the series connection among the positive electrodes 13 and the negative electrodes 14 in the six photo-electric converting elements 2, are connected to the control circuit 5 to accumulate the generated electric power.

The light emitting diode 3 has an AlGaAs-based hetero structure, and as shown in FIG. 1, is arranged substantially in the center of the self light-emitting device 1. This light emitting diode 3 blinks only where light is low, such as at night, by the below-mentioned light emitting control circuit 22 using the electric power generated by the spherical photo-electric converting elements 2 and accumulated in a condenser 21.

The sealing member 4 is formed with appropriate synthetic resin, such as epoxy resin, and embeds integrally the whole elements such as the spherical photo-electric converting elements 2, the light emitting diode 3 and the control circuit 5. Condenser lenses 6 to guide or condense incident light are integrally formed in a position corresponding to the external surface side of each spherical photo-electric converting element 2, respectively, and a projection lens 7 is also integrally formed at a position corresponding to the light emitting diode 3, on the upper surface of the sealing member 4. As shown in FIG. 2, the surfaces of the condenser lenses 6 are formed to be hemispheric, regarding the spherical photo-electric converting element 2 as a center, respectively, and light entering the surfaces of the condenser lens 6 is condensed to the spherical photo-electric converting element 2, respectively. The surface of the projection lens 7 is formed to be partially spheroidal, and light emitted from the light emitting diode 3 is diffused by the project lens 7 and transmitted to the outside. Furthermore, the epoxy resin that forms the sealing member 4 including the lenses 6 and 7 is a material capable of transmitting a photo-electrically converted light by the spherical photo-electric converting elements 2.

The control system of this self light-emitting device 1 is described next.

Figure 4:
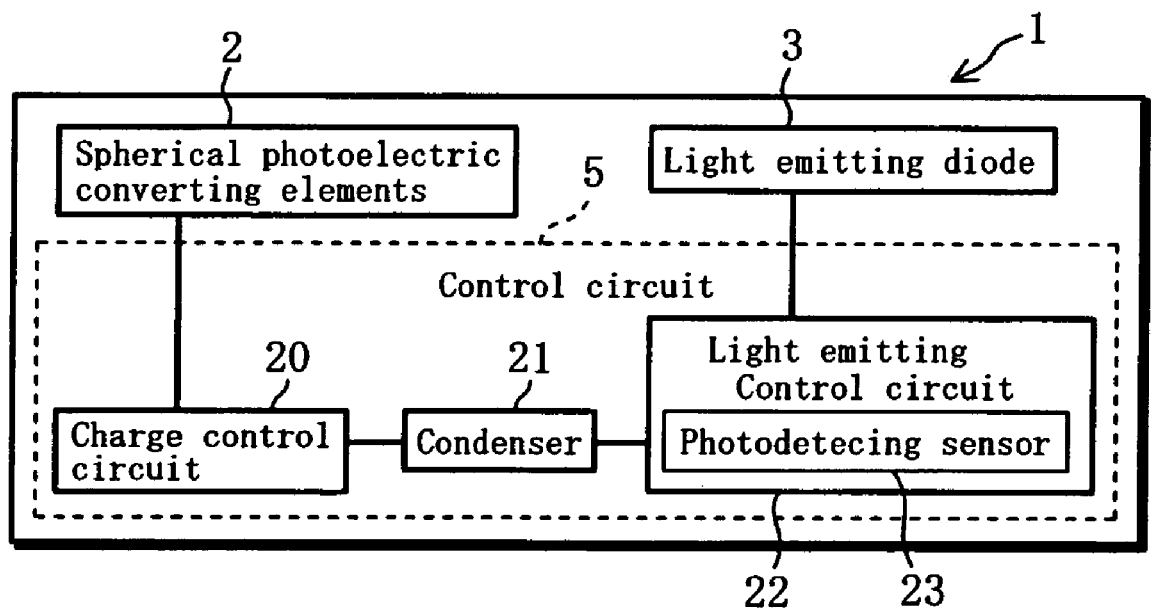
FIG. 4 is a block diagram for explaining a control system of the self light-emitting device.

As shown in FIG. 4, the control circuit 5 is equipped with a charge control circuit 20, a condenser 21 made of a capacitor, and a light emitting control circuit 22. These charge control circuit 20, condenser 21 and light emitting control circuit 22 are mounted on the same substrate, and as shown in FIG. 2, are arranged on the lower sides of the spherical photo-electric converting elements 2 and the light emitting diode 3. The control circuit 5, in a state in which electric power is generated by the spherical photo-electric converting elements 2 during the day, the light emitting control circuit 22 prohibits the light emitting diode 3 from emitting light, and the generated electric power is charged in the condenser 21 by the charge control circuit 20; and in a state in which light is low, such as at night, the light emitting diode 3 is driven to emit blinking light by the light emitting control circuit 22 using the electric power accumulated in the condenser 21.

Figure 6:
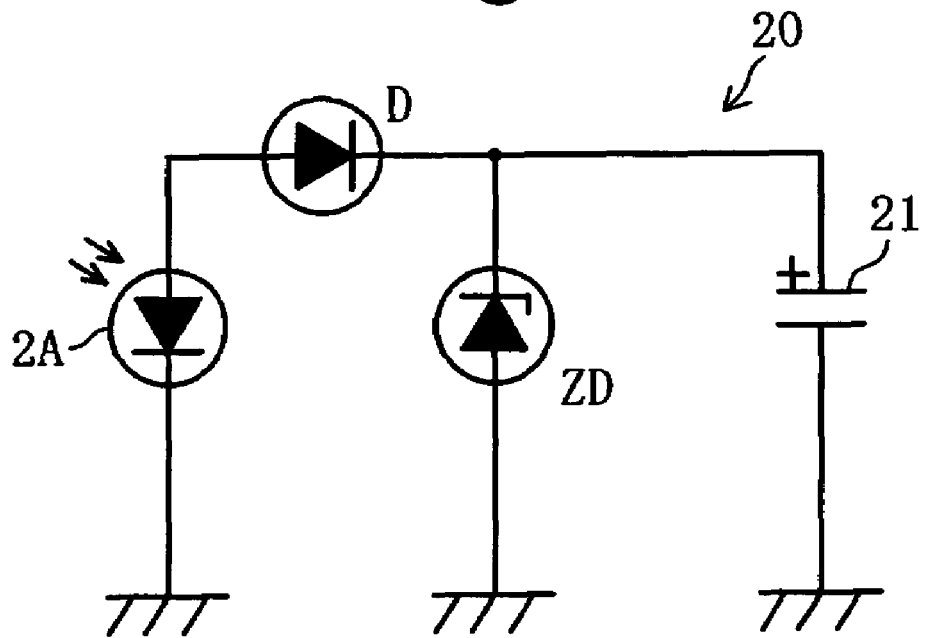
FIG. 6 is a circuit diagram for explaining a charge control circuit.

The charge control circuit 20 is for the control of the charge to the condenser 21; to prevent excess current to the condenser 21; and to prevent reverse current to the spherical photo-electric converting elements 2. As shown in FIG. 6, the charge control circuit 20 comprises a diode D to prevent reverse current and a constant-voltage element ZD.

The operation of the charge control circuit 20 is described next.

Figure 5:
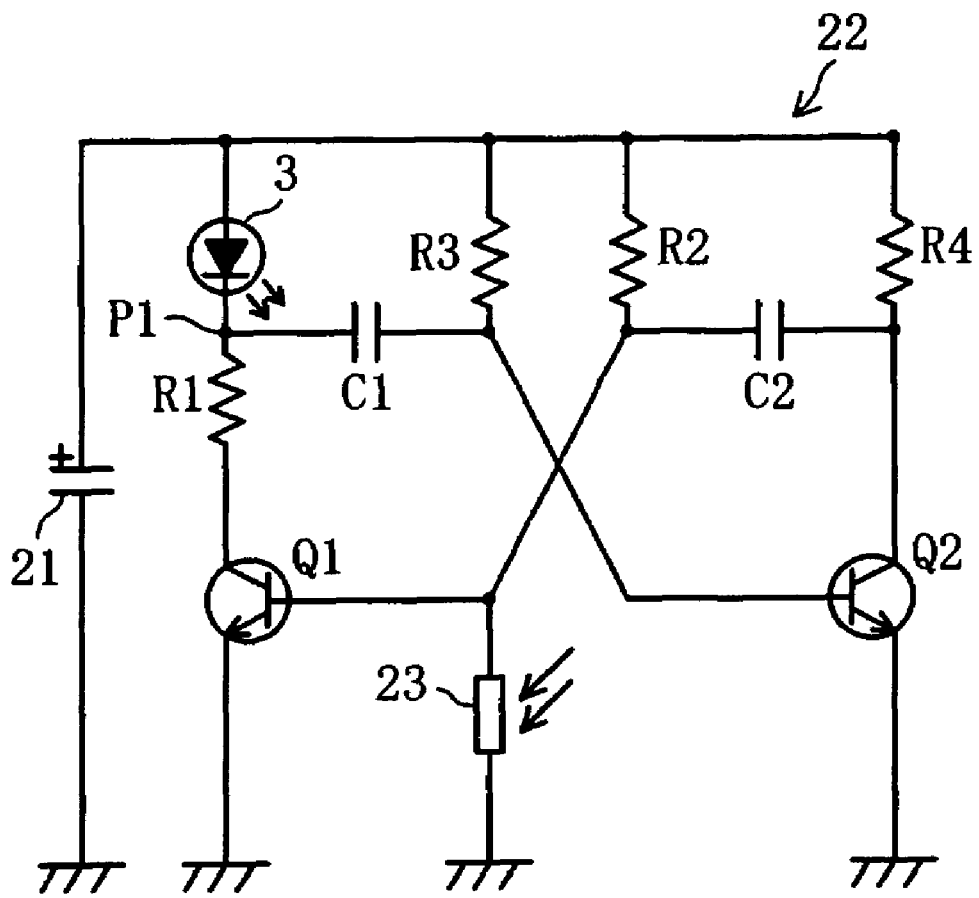
FIG. 5 is a circuit diagram for explaining a light emitting control circuit.

The electric current generated by electric power generating device 2A where the six spherical photo-electric converting elements 2 are connected in series is charged in the condenser 21 via the diode D. If incidental light to the electric power generating device 2A decreases and the output voltage of the condenser 21 is greater than that of the spherical photo-electric converting elements 2, the diode D functions to prevent reverse current from the condenser 21 from reaching the electric power generating device 2A. When the electric power accumulated in the condenser 21 reaches a pre-determined voltage, the constant-voltage element ZD grounds the electric power generated by the electric power generating device 2A, preventing excess current from reaching the condenser 21 and enables the prolongation of the life of the condenser 21. Furthermore, if the maximum output of the electric power generating device 2A is smaller than the sum of the maximum allowable voltage and the threshold voltage of the diode D, the constant-voltage element ZD can be omitted. The light emitting control circuit 22 controls the power distribution to the light emitting diode 3 and for blinking the light emitting diode 3 in a state in which light is low, such as at night. As shown in FIG. 5, the light emitting control circuit 22 is a control circuit where a photo-detecting sensor 23 is incorporated into the astable multivibrator, which has two transistors Q1, Q2, four resistors R1, R2, R3, R4 and condensers C1, C2. The photo-detecting sensor 23 is an optical response resistive element mainly formed with CdS, and its resistance value changes depending upon the quantity of a received light. Furthermore, the resistance values of each resistor are, for example, R1=3.3 Ω, R2=1 MΩ, R3=510 kΩ and R4=51 kΩ.

The operation of this light emitting control circuit 22 is described next.

First, an operation in a state in which light has been detected by the photo-detecting sensor 23, such as during the day, is described. In a state in which the light has been detected by the photo-detecting sensor 23, because the resistance value for the photo-detecting sensor 23 decreases and the base of the transistor Q1 is grounded, the base electrical potential of the transistor Q1 decreases to a threshold or less, and no conduction between a collector and emitter of the transistor Q1 occurs and no electric current flows to the resistor R1. In the meantime, the base electric potential of the transistor Q2 becomes a threshold or greater, so electric current flows from the resistor R4 to the earth. However, due to 51 kΩ of resistance value on the resistor R4 and the maximum voltage 3V applied to the resistor R4, the maximum electric current flowing into the resistor R4 is only several dozens μA. In the meantime, because the electric current flowing from the electric power generating device 2A to the condenser 21 is several mA, charging the condenser 21 is hardly affected.

An operation where the light emitting diode 3 is driven to blink by the light emitting control circuit 22 when no light is detected by the photo-detecting sensor 23, such as at night, is described next.

In a state in which light is low, such as at night, if no light is detected by the photo-detecting sensor, the resistance value for the photo-detecting sensor 23 increases and the base electric potential of the transistor Q1 gradually ascends. Accompanying the ascent of the base electric potential of the transistor Q1, electric current flowing in the resistor R2 flows via the condenser C2, so electrical charge is accumulated in the condenser C2.

When the base electric potential of the transistor Q1 reaches the threshold, the cut-off state between the collector and the emitter of the transistor Q1 instantaneously changes to the conduction state. In a state in which light is detected by the photo-detecting sensor 23, positive electric charge is accumulated in the electrode of the condenser C1 on the resistor R1 side, and negative electric charge is accumulated in the electrode of the condenser C1 on the resistor R3 side. Because conduction between the collector and the emitter of the transistor Q1 causes the instantaneous descent of the electric potential at a junction point P1 of the light emitting diode 3, the resistor R1 and the condenser C1, and the base electric potential of the transistor Q2 becomes a threshold or less due to the electric charge accumulated in the condenser C1, and the transistor Q2 is blocked.

In the meantime, the conduction of the transistor Q1 causes the flow of the electric current via a route of the light emitting diode 3, the resistor R1 and between the collector and the emitter of the transistor Q1; and the light emitting diode 3 emits light. Because the electric current flows into the condenser C1 via the resistor R3, only a pre-determined quantity of the electric charge accumulated in the condenser C1 is discharged. After the electric charge is discharged due to the electric current flowing via the resistor R4, the electric charge is accumulated in the condenser C2.

Since the condenser C1 is gradually charged due to the electric current flowing into the resistor R3, the base electric potential of the transistor Q2 gradually ascends. When the base electric potential of the transistor Q2 reaches the threshold, the cut-off state between the collector and the emitter of the transistor Q2 instantaneously changes to the conduction state. When the conduction of the transistor Q2 causes grounding of the collector of the transistor Q2, the base electric potential of the transistor Q1 instantaneously descends to the threshold or less due to the electric charges accumulated in the condenser C2, and conduction between the collector and the emitter of the transistor Q1 instantaneously changes to the cut-off state.

When the transistor Q2 is conducted, the electric current flows via the route of the light emitting diode 3, the condenser C1 and between the base and the emitter of the transistor Q2, and via a route of the resistor R3 and between the base and the emitter of the transistor Q2. When the condenser C1 is charged to a pre-determined quantity due to the electric current flowing via the light emitting diode 3, no electric current flows into the light emitting diode 3 and the light electric diode 3 turns the light out. The accumulated electric charge is gradually discharged into the condenser C2 due to the electric current flowing via the resistor R2, and the condenser C2 is charged. As the condenser C2 is charged, the base electric potential of the transistor Q1 gradually ascends, and when it reaches a threshold, the transistor Q1 conducts. In the meantime, the transistor Q2 is cut off and the light emitting diode 3 emits light again. Subsequently, the operation is repeated, and the light emitting diode 3 is driven to blink.

Compared to the internal resistance of the light emitting diode 3 and the resistance value of the resistor R4, which are the charging route of the condenser C1 and the condenser C2, the resistance values for the resistor R3 and the resistor R2 are established to be sufficiently great, so the interval time to blink the light emitting diode 3 is determined according to the discharge time C1 and C2, respectively. In other words, the time to emit light and to turn the light off depends upon (the electric capacity of the condenser C1)×(the resistance value of the resistor R3) and (the electric capacity of the condenser C2)×(the resistance value of the resistor R2).

The test results are described next. When using the self light-emitting device 1 where a capacitor with 2F of electrostatic capacity is applied as the condenser 21, when the sample is charged under the 100,000 lx of illuminance within a solar simulator, electric power is accumulated in the condenser 21 in 1 hour, and it is possible that the light emitting diode 3 emits blinking light for 8 hours or longer with a light emitting pattern of 1-3 mcd of emission luminance and 30% of duty ratio. Furthermore, this self light-emitting device 1 is configured with approximately 20 mm of diameter, approximately 3 mm of thickness according to a planar view, and approximately 5 g of weight. When using the self light-emitting device 1 where a capacitor with 0.47 F of electrostatic capacity is applied as the condenser 21, when the sample is charged under 100,000 lx of illuminance within a solar simulator, the electric power is accumulated in the condenser 21 in 20 min., and it is possible that the light emitting diode 3 emits blinking light for 2 hours or longer with a light emitting pattern of 1-3 mcd of emission luminance and 30% of duty ratio. Furthermore, the self light-emitting device 1 with this construction is configured with approximately 12 mm of diameter and approximately 3 mm of thickness according to a planar view, and approximately 3 g of weight.

An operation and the efficacy of the self light-emitting device 1 is described next. With this self light-emitting device 1, since the light receiving surface (pn-joint 11) of the spherical photo-electric converting elements 2 that generate electric power is formed to be substantially spherical, respectively, when the present embodiment, it is possible to generate electric power relative to incidental light at any angle from the upper side, and electric power can be generated regardless of the installation location or installation angle and the generated electric power can accumulate in the condenser 21, improving the degree of freedom for the installation location and the installation angle. The establishment of the six spherical photo-electric converting elements 2 enhances the power generation voltage to be 6 times greater compared to when generating electric power by one spherical photo-electric converting element 2, realizing a reduction of charging time. Since the condenser lenses 6 are formed, incident light can be condensed and received on the spherical photo-electric converting elements 2, so the introduction efficiency of light, such as sunlight, can be improved. As described above, since it is possible to blink the light emitting diode 3 for 8 hours with 1 hour of accumulation of electric power, even though the weather may be somewhat bad, the situation where the light emitting diode 3 will no longer emit light can be prevented.

The self light-emitting device 1 can greatly realize the described miniaturization and light weight, so it can be easily carried, and even if it is attached to a bag or a cap, the user hardly feels a burden. The sealing member 4 including the lenses 6, 7 embeds integrally the whole elements such as the spherical photo-electric converting elements 2, the light emitting diode 3 and the control circuit 5, so the self light-emitting device 1 is resistant to rain and dust, with excellent weather resistance, and it can be installed at any location, and even if it is carried, it will not become damaged. Forming the lenses 6, 7 with epoxy resin, which is the same as the sealing member 4, enables additional improvement of strength.

Since the self light-emitting device 1 is equipped with the condenser 21, the light emitting diode 3 can emit light even in a state in which it is impossible to generate electric power by the spherical photo-electric converting elements 2, such as at night. The application of an astable multivibrator to the light emitting control circuit 22 enables blinking the light emitting diode 3, with improved surrounding visibility. Since the photo-detecting sensor 23 is incorporated in the position shown in FIG. 5, the grounded electric current from the condenser 21 can be controlled to be minimal, shortening the charging time, and, and emission from the light emitting diode 3 can be prohibited. Since the self light-emitting device 1 is equipped with the charge control circuit 20 shown in FIG. 6, any excess current to the condenser 21 can be prevented, and any reverse current to the spherical photo-electric converting elements 2 from the condenser 21 can also be prevented, prolonging the life of the condenser 21 and the spherical photo-electric converting elements 2.

Figure 7:
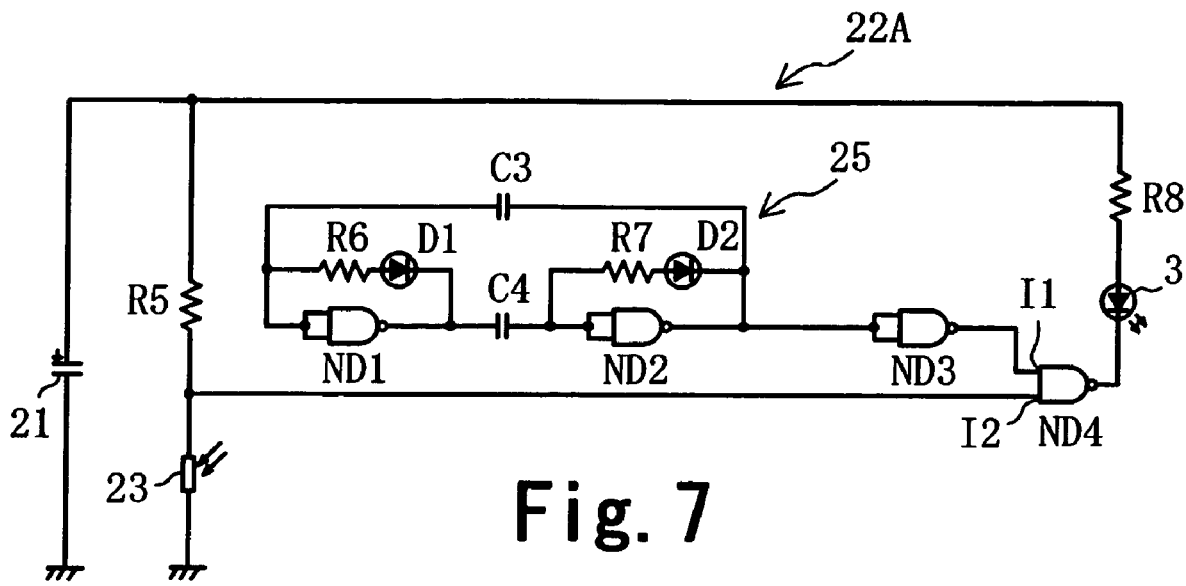
FIG. 7 is a circuit diagram of a light emitting control circuit relating to a modified embodiment.

A modified embodiment of the light emitting control circuit 22 is described next. The astable multivibrator using transistors is applied to the light emitting control circuit 22. However, as shown in FIG. 7, a light emitting control circuit 22A that has an astable multivibrator using IC can be applied. Furthermore, the same ones as those of the embodiment are applied to the photo-detecting sensor 23, the light emitting diode 3 and the condenser 21, respectively, so the same reference numerals are used and the description is omitted.

An operation of the light emitting control circuit 22A is described next. Since the light emitting control circuit 22 is a control circuit where the photo-detecting sensor 23 is applied to a general IC type astable multivibrator 25, it is briefly described. In a state in which light is detected by the photo-detecting sensor 23, such as during the day, electric current discharged from the condenser 21 is grounded via the resistor R5 and the photo-detecting sensor 23, an input terminal I2 of an NAND circuit ND4 is always maintained at a low level, so the output of the NAND circuit ND4 becomes a high level. Therefore, since electric current will not flow into the light emitting diode 3, the light emitting diode 3 will not emit light. However, since a resistor with a very great resistance value is applied to the resistor R5, even if light is detected by the photo-detecting sensor 23, electric current discharged from the condenser 21 via the resistor R5 is small, so charging the condenser will hardly be affected.

Operation of the light emitting control circuit 22A is described in a state in which light is hardly detected by the photo-detecting sensor 23, such as at night, so the resistance value for the photo-detecting sensor 23 becomes greater and electric current hardly flows into the photo detecting sensor 23. Since electric current hardly flows into the photo-detecting sensor 23 in this state, the input terminal I2 of the NAND circuit ND4 is always at a high level. If the input side of an NAND circuit ND1 is initially at a low level and no electric charge has been accumulated in the condenser C4, since the output side of the NAND circuit ND1 is at a high level, electric current flows to the output of the NAND circuit ND1, the condenser C4, a resistor R7, a diode D2 and the output of an NAND circuit ND2, and electric charge is accumulated in the condenser C4.

The condition where the electric charge has started being accumulated in the condenser C4 is the same condition where the condenser C4 is short-circuited, so the input of the NAND circuit ND2 becomes a high level. As a result, the output of the NAND circuit ND2 is at a low level. In this state, the input of the NAND circuit ND3 becomes a low level and the output becomes a high level, so the input terminal I1 of the NAND circuit ND4 also becomes a high level. As a result, because the input terminal I2 of the NAND circuit ND4 is also at a high level, the output of the NAND circuit ND4 becomes a low level, and electric current flows into the light emitting diode 3 from the condenser 21, and the light emitting diode 3 emits light.

Next, when the electric charge is accumulated in the condenser C4, the electric current flowing into the condenser C4 diminishes, and the voltage on the input side of the NAND circuit ND2 gradually descends, and when the voltage on the input side of the NAND ND2 becomes a threshold voltage, the input of the NAND circuit ND2 instantaneously becomes a low level. Associated with this, the output becomes a high level. When the output of the NAND circuit ND2 becomes a high level, the input of the NAND circuit ND3 becomes a high level and the output becomes a low level. Then, the input terminal I1 of the NAND circuit ND4 becomes a low level. As a result, because the output of the NAND circuit ND4 becomes a high level, no electric current flows into the light emitting diode 3, and the light emitting diode 3 no longer emits light.

Next, when the output of the NAND circuit ND2 becomes a high level, the input of the NAND circuit ND1 also becomes a high level. No electric current flows into the diode D2, but the electric current flows into the output of the NAND circuit ND2, the condenser C3, the resistor R6, the diode D1 and the output of the NAND circuit ND1. Since the output of the NAND circuit ND1 is at a low level, the electric charge accumulated in the condenser C4 is discharged. When the electric charge is accumulated due to the electric current from the output of the NAND circuit ND2, the voltage of the input of the NAND circuit ND1 gradually descends, and when the voltage becomes a threshold voltage or less, the output of the NAND circuit ND1 becomes a high level, so the light emitting diode 3 emits light. As mentioned above, the repetition of the operation results in driving the light emitting diode 3 to blink.

When the condenser 21 with 2 F of electrostatic capacity is applied to the electric power generating control circuit 22A shown in FIG. 7 and electric power is accumulated under 100,000 lx of illuminance within a solar simulator, it is confirmed that the electric power accumulates in 1 hour, and the light emitting diode 3 emits light for 16 hours or longer with a light emission pattern of 1-3 mcd of light emission luminance and 30% of duty ratio. Furthermore, the self light-emitting device 1 with this construction can be configured with approximately 20 mm of diameter and approximately 8 mm of thickness according to a planar view, and approximately 7 g of weight.

Embodiment 2 (Refer to FIG. 9 through FIG. 12)

A self light-emitting device in Embodiment 2 is described next. The present embodiment is an example of applying the present invention to a self light-emitting device that has a wavelength conversion display function to receive infrared rays from the sunlight and to convert and emit them as visible rays.

Figure 9:
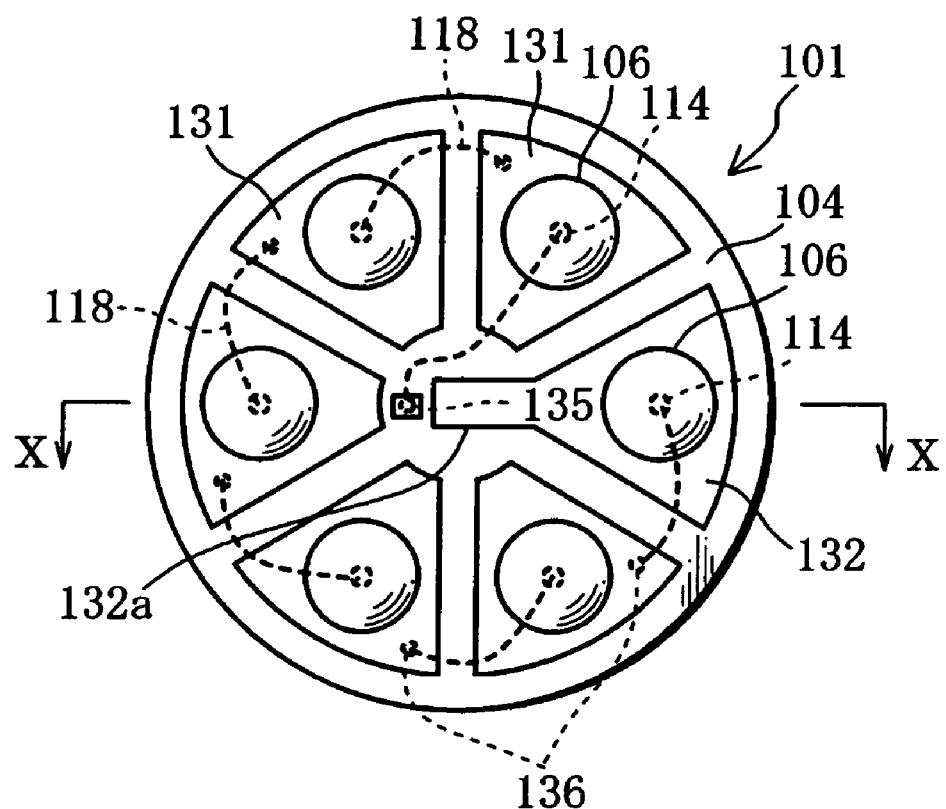
FIG. 9 is a plane view of a self light-emitting device of the second embodiment.
Figure 10:
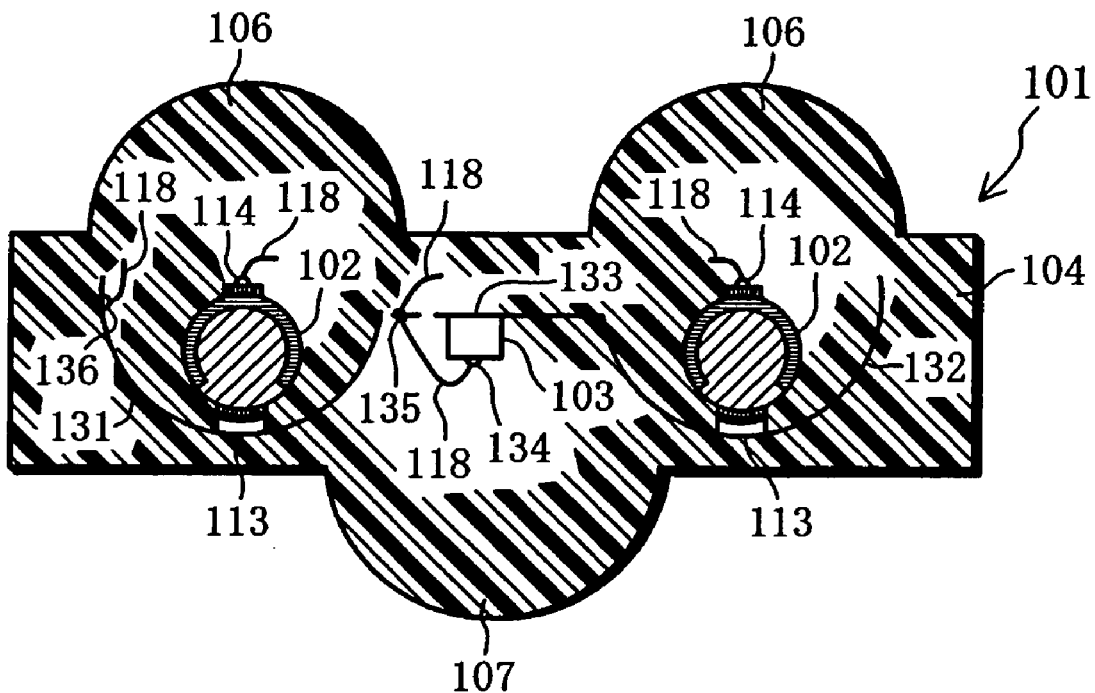
FIG. 10 is a cross-sectional view along X-X line in FIG. 9.

As shown in FIGS. 9 and 10, a self light-emitting device 101 is equipped with six spherical photo-electric converting elements 102, a visible light LED chip 103, a sealing member 104, and lead frames 131, 132. Furthermore, the six converting elements 102, the sealing member 104, a circuit where the six converting elements 102 are connected in series, and lenses 106 are substantially similar to those in above described embodiment, so only different construction is described. Furthermore, the converting elements 102 generate electric power due to visible rays in the sunlight, as well, but they excel in its special quality of the power generation due to infrared rays.

The LED chip 103 emits colored visible rays due to electric power generated by the converting elements 102. The sealing member 104 is formed with transparent synthetic resin, such as epoxy resin, and it embeds integrally is the whole elements, such as the six converting elements 102, the LED chip 103 and lead frames 131, 132.

The six condenser lenses 106 corresponding to the six converting elements 102 are formed on the upper side of the sealing member 104, and each condenser lens 106 is formed to be hemispheric. One projection lens 107 is formed to be hemispheric on the lower side of the sealing member 104 regarding the LED chip 103 as a center.

The five lead frames 131 and a lead frame 132 have a partially spherical reflector where incident light can be reflected, respectively, and the lead frame 132 has an extension 132a extending toward the center. The converting elements 102 are positioned on the focal points of the reflectors of a total of six lead frames 131, 132, respectively. Therefore, infrared rays that have not entered into the converting elements 102 but have transmitted are reflected on the reflectors of the lead frames 131, 132, and enter into the converting elements 102 arranged on the focal positions of the reflectors.

Positive electrodes 113 of the converting elements 102 are connected to the reflectors of the corresponding lead frames 131, 132 using a conductive adhesive, respectively. A positive electrode 133 of the LED chip 103 is connected to the lower surface of the extension 132a of the lead frame 132 using a conductive adhesive, and a negative electrode 134 of the LED chip 103 is connected to an electrode 135 adjacent to the LED chip 103 by a copper wire 118. The electrode 135 is connected to the negative electrode 114 of one of the converting elements 102 by the copper wire 118. The positive electrodes 136 in the vicinity of the end of each lead frame 131 are electrically connected to the negative electrode 114 of the adjacent converting element 102 by the copper wire 118, respectively, and the six converting elements 102 are connected to the lead frames 131, 132 in series by the five copper wires 118 as illustrated.

In this self light-emitting device 101, electric power is generated when the six converting elements 102 receive infrared rays, and the electric power is supplied to the LED chip 103 and colored light is emitted. This is equivalent to a wavelength conversion device that converts non-visible infrared rays into visible rays.

Figure 11:
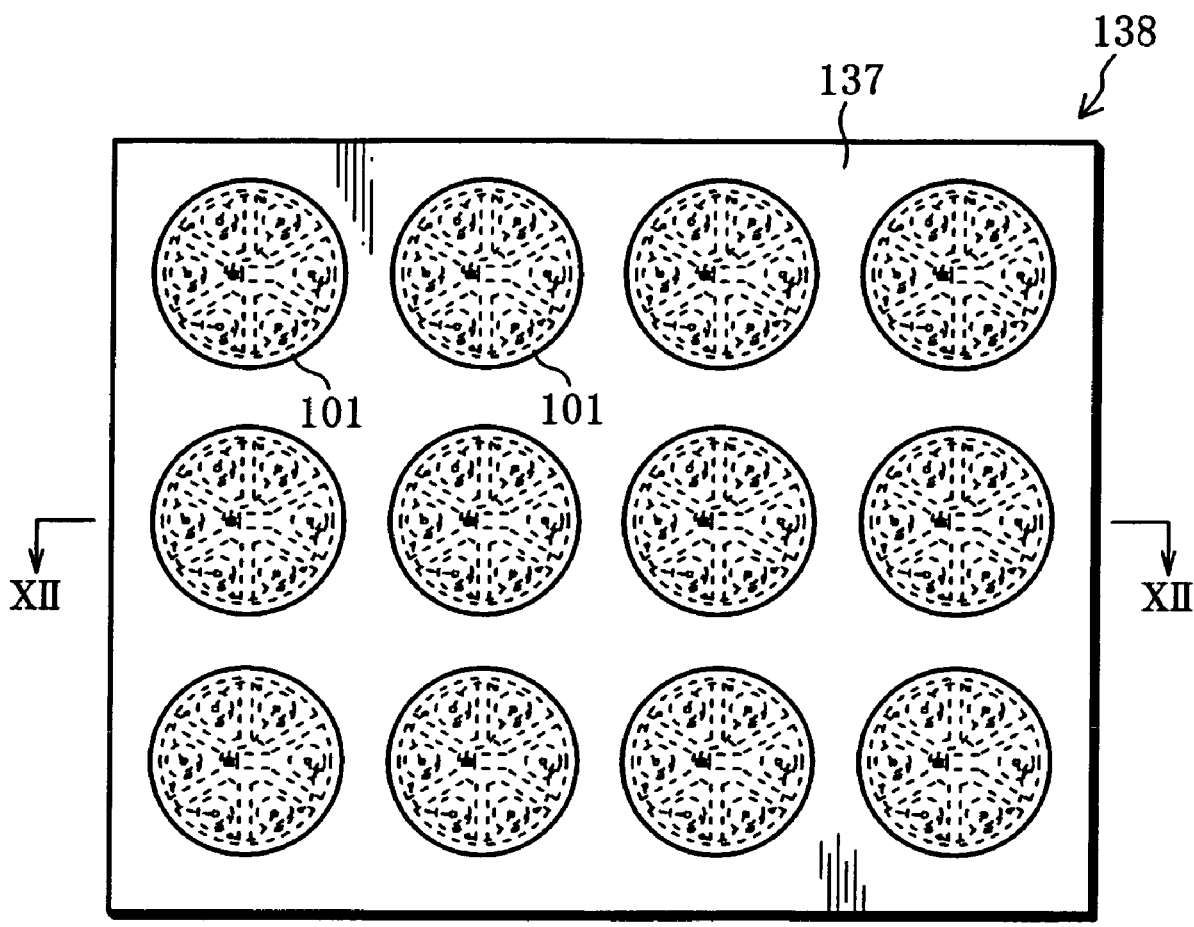
FIG. 11 is a plane view of a panel-type self light-emitting device.
Figure 12:
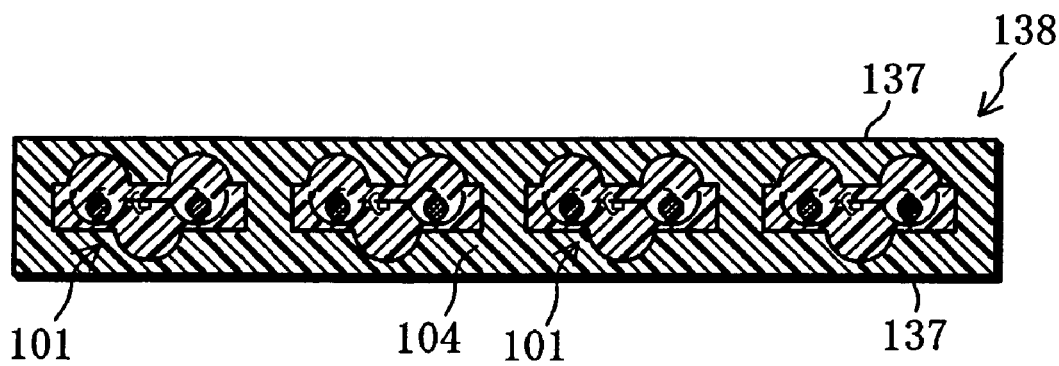
FIG. 12 is a cross-sectional view along XII-XII line in FIG. 11.

The self light-emitting device 101 itself is independently usable. However, as shown in FIGS. 11 and 12, the arrangement of multiple self light-emitting devices 101 between two transparent panels 137 and sealing them to be buried using transparent synthetic resin enables the construction of a panel-type self light-emitting device 138, as well. With the self light-emitting device 138 shown in FIGS. 11 and 12, the self light-emitting devices 101 are arranged to be a matrix with three rows and four columns.

For example, if the LED chip 103 emits red-colored light, and if the headlights of an oncoming vehicle is irradiated; it can be used as a display unit to emit a red-colored light indicating a hazard display. Further, the arrangement of multiple LED chips 103 to be a pre-determined figure or letter enables the display of the figure or letter. Further, if multiple LED chips 103 are arranged to be dot-matrix, the control of the LED chips 103 to be ON/OFF enables the display of various figures and/or letters. Other construction, operation and efficacy are similar to those in the embodiment.

Embodiment 3 (Refer to FIG. 13 through FIG. 15)

A self light-emitting device relating to Embodiment 3 is described next.

The present embodiment is an example where the present invention is applied to an ultraviolet monitoring device, which is a self light-emitting device, where three light emitting diodes with different luminous colors from each other are arranged and a selected light emitting diode emits light according to the intensity of ultraviolet rays. Only the constructions different from that of Embodiment 1 are described.

As shown in FIGS. 13 and 14, an ultraviolet monitoring device 201 is equipped with twenty-four spherical photo-electric converting elements 202, three light emitting diodes 203 that emit the three colors of RGB, respectively, an ultraviolet sensor 223, a sealing member 204, a printed substrate 206 and a light emitting control circuit 205.

As shown in FIG. 15, the three light emitting diodes 203 indicate a red (R) light emitting diode LED1, a yellow (Y) light emitting diode LED2 and a green (G) light emitting diode LED3. In the ultraviolet monitoring device 201, the intensity of the ultraviolet rays to be detected by an ultraviolet sensor 223 is graded to three levels, Level 1 (weak), Level 2 (medium) and Level 3 (strong), and the G, Y and R light emitting diodes emit light corresponding to the Levels 1, 2 and 3, respectively. The twenty-four converting elements 202 are arranged on the surface of the printed substrate 206 to form a matrix with six rows and four columns. The converting elements 202 are similar to the spherical photo-electric converting elements 2 in Embodiment 1. However, they are arranged on the printed substrate 206 where the conductive direction to connect the positive and negative electrodes is aligned in a column direction, and for example, the converting elements 202 in each column are connected in series and the converting elements 202 in each row are connected in parallel.

In other words, the twenty-four converting elements 202 constitute electric power generating device 221 by connecting in series and in parallel. This electric power generating device 221 generates approximately 3.6 V of photo-electromotive force when the weather is fine. The ultraviolet sensor 223 is made of a photodiode, and generates voltage according to the intensity of the received ultraviolet rays integrally. For example, the sealing member 204 formed with transparent epoxy resin covers the whole elements, such as the twenty-four converting elements 202, the three light emitting diodes 203, the printed substrate 206, the light emitting control circuit 205 and the ultraviolet sensor 223. A reflector film to reflect incident light toward the converting elements 202 is formed on the surface of the printed substrate 206. Furthermore, lenses corresponding to the converting elements 202 can be integrally formed on the surface of the sealing member 204. The light emitting control circuit 205 is incorporated on the rear surface of the printed substrate 206, and is covered with the sealing member 204.

As shown in FIG. 15, the light emitting control circuit 205 is equipped with a direct-current amplifying circuit 241 and a diode drive circuit 242, and drives the light emitting diodes 203 so as to allow either light emitting diode 203 to emit light according to the output of the ultraviolet sensor 223.

The direct-current amplifying circuit 241 is connected to the ultraviolet sensor 223; the direct current amplifying circuit 241 is equipped with operational amplifiers OP1, OP2, resistors R9 through R15 and condensers C5 through C7; and amplifies voltage generated according to the intensity of the ultraviolet rays detected by the ultraviolet sensor 223; and transmits the voltage.

The operational amplifiers OP1, OP2 are inverting amplifiers where feedback is applied by the resistors R11, R15, and they are operable with a unipolar light source due to the output from the solar battery. A reference voltage is applied to the plus input terminals of the operational amplifiers OP1, OP2 from the electric power generating device 221 by voltage dividing resistors R9, R10; and R13, R14 from the electric power generating device 221, respectively. The output terminal of the ultraviolet sensor 223 is connected to the minus input terminal of the operational amplifier OP1.

When the ultraviolet sensor 223 receives sunlight, it generates voltage according to the intensity of the ultraviolet rays in the sunlight. In the operational amplifier OP1, the input voltage is invertingly amplified in order for the voltage of the minus input terminal to be the same electric potential as the voltage of the plus input terminal due to the feedback effect by the resistor R11, so the greater the intensity of the ultraviolet rays, the more the electric potential of the output terminal of the operational amplifier OP1 descends. Similarly, the input voltage is invertingly amplified in the operational amplifier OP2. Therefore, the output of the ultraviolet sensor 223 is non-invertingly amplified due to the repetition of inverting amplification twice by the operational amplifiers OP1, OP2, and the greater the intensity of the ultraviolet rays becomes, the higher the output voltage of the operational amplifier OP2 becomes.

The output voltage of the operational amplifier OP2 is applied to the minus input terminals of comparators CP1, CP2 of the diode drive circuit 242. The diode drive circuit 242 for driving the three light emitting diodes 203 (LED1 through LED3) is connected to the electric power generating device 221, and the diode drive circuit 242 has comparators CP1, CP2 and resistors R16 through R21.

Reference voltages V1, V2 are applied to the comparators CP1, CP2 from the electric power generating device 221 via the voltage dividing resistors R16 through R18, respectively. The comparators CP1, CP2 compare the reference voltages V1, V2 of the plus input terminal with the voltage of the minus input terminal, an 'H' level signal is transmitted if the reference voltages V1, V2 are higher, and a 'L' level signal is transmitted if the reference voltages V1, V2 are lower.

An operation to drive the light emitting diodes LED1 through LED3, whose luminous colors are different from each other, according to the intensity of the ultraviolet rays is described. If an output voltage V0 of the direct-current amplifying circuit 241 is lower than the reference voltage V2 to be applied to the comparator CP2 (the intensity of the ultraviolet rays is weak: Level 1), the output of the comparator CP2 becomes the 'H' level, and the light emitting diode LED 3 emits green light. However, since the output terminal of the comparator CP1 also transmits a 'H' level signal, the input terminal and the output terminal are the same electric potential on the light emitting diodes LED1, LED2, so these diodes do not emit light.

Next, if the output voltage V0 of the direct-current amplifying circuit 241 is a value between the reference voltage V1 of the comparator CP1 and the reference voltage V2 of the comparator CP2 (the intensity of the ultraviolet rays is medium: Level 2), the comparator CP2 transmits an 'L' level signal, and the comparator CP1 transmits an 'H' level signal. Therefore, the light emitting diode LED2 emits yellow light. However, the input terminal and the output terminal are the same electric potential on the light emitting diodes LED1, LED3, so these diodes do not emit light.

Next, if the output voltage V0 of the direct-current amplifying circuit 241 is higher than the reference voltage V1 of the comparator CP1 (the intensity of the ultraviolet rays is strong: Level 3), the outputs of the comparators CP1, CP2 become both the 'L' level, so the light emitting diode LED1 emits red light. However, the input terminal and the output terminal are the same electric potential on the light emitting diodes LED2, LED3, so these diodes do not emit light.

As described above, according to the intensity of the ultraviolet rays received by the ultraviolet sensor 223, the ultraviolet monitoring device 201 operates the green light emitting diode if the intensity of the ultraviolet rays is weak; operates the yellow light emitting diode if the intensity of the ultraviolet rays is medium; and operates the red light emitting diode if the intensity of the ultraviolet rays is strong, so it can be displayed at three levels.

Next, examples of the resistance values for the resistors and the capacity of the condensers incorporated into a circuit, are as follows: R9=750 kΩ, R10=220 kΩ, R11=220 kΩ, R12=10 kΩ, R13=750 kΩ, R14=220 kΩ, R15=82 kΩ, R16=1 MΩ, R17=470 kΩ, R18=1 MΩ, R19=56 Ω, R20=22 Ω, R21=22 Ω, C5=68 pF, C6=68 pF and C7=10 µF.

Furthermore, not limiting to the three-level display according to the intensity of the ultraviolet rays, it is also possible to display four levels or more by increasing the comparators to 3 systems or more. Even for the number of the light emitting diodes 203, not one diode per color but multiple diodes can emit light per color, and the luminous colors of the light emitting diodes can be appropriately selected from applicable various light emitting diodes. In the present embodiment, the electric power generating device 221 is directly applied as a light source. However, it can be constructed so that a condenser or a secondary battery is established instead of the electric power generating device 221 shown in FIG. 15, to supply the generated electric power by the electric power generating device 221 shown in FIG. 13 to the condenser or secondary battery.

Figure 16:
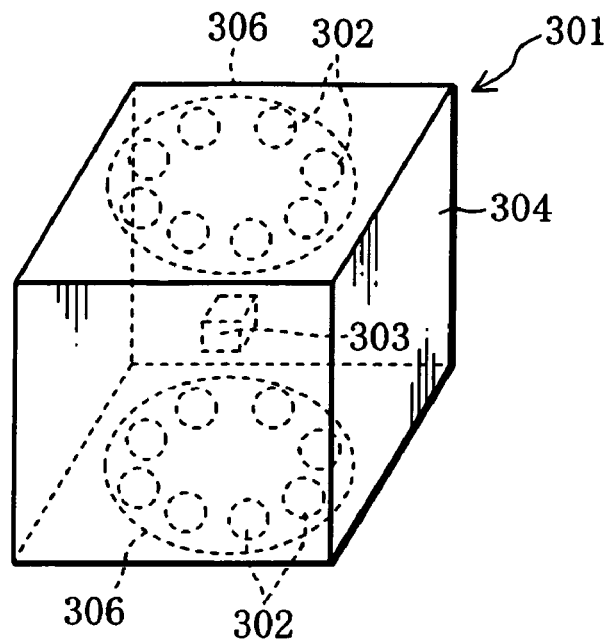
FIG. 16 is a perspective view of a self light-emitting cube of the forth embodiment.

Embodiment 4 (Refer to FIG. 16)

A self light-emitting device relating to Embodiment 4 is described next.

The present embodiment is an example of when applying the present invention to a self light-emitting cube 301 where electricity is generated by multiple spherical photo-electric converting elements 302, and a white-color light emitting diode 303 situated in the center of a transparent cube emits light. The spherical photo-electric converting elements 302 and its series-connected circuit are substantially similar to those in the Embodiment 1, so its description is omitted, and only the different constructions are described. As shown in FIG. 16, the self light-emitting cube 301 is equipped with eight converting elements 302 on the upper surface side, another eight converting elements 302 on the lower surface side, a white-color light emitting diode 303 and a cube sealing member 304.

The sealing member 304 is formed to be a cube using transparent epoxy resin in a state where both upper and lower converting elements 302 and the white-color light emitting diode 303 are buried. The white-color light emitting diode 303 is arranged in the center of the sealing member 304, and the entire sealing member 304 functions as a light transmission member to transmit light through.

The upper eight and lower eight spherical photo-electric converting elements 302 are arranged around the inside of the external circumference on the surface of circle translucent glass epoxy substrate 306 along the circumferential direction at approximately 45° of intervals, respectively, and the eight converting elements 302 are connected by copper wires (not shown) in series, respectively. The eight converting elements 302 are arranged on the upper surface of one substrate 306 on the upper side, and another eight converting elements 302 are arranged on the lower surface of the other substrate 306 on the lower side, and, the upper converting element series-connected body and the lower converting element series-connected body are connected in parallel.

Any description about the light emitting control circuit is omitted, but it is designed that the white-color light emitting diode 303 directly emits light using electric power generated by the converting elements 302. Therefore, when either upper or lower eight spherical photo-electric converting elements 302 in the cube-shaped sealing member 304 receive light, the white-color light emitting diode 303 emits light due to the photo-electromotive force, so the light emission can be clearly confirmed even under an incandescent light or with a cloudy sky outside. Other construction, effect and efficacy are similar to those of embodiments described hereinbefore.

Figure 17:
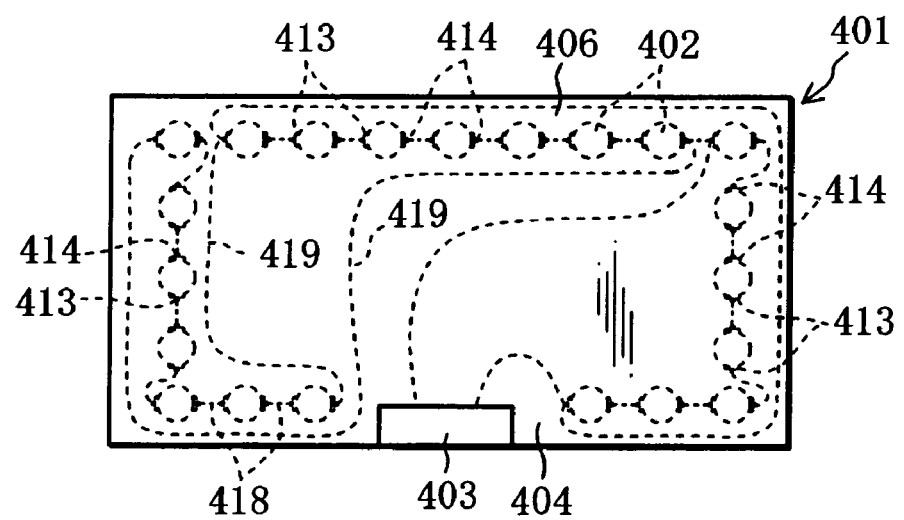
FIG. 17 is a plane view of the self light-emitting name plane of the fifth embodiment.
Figure 18:
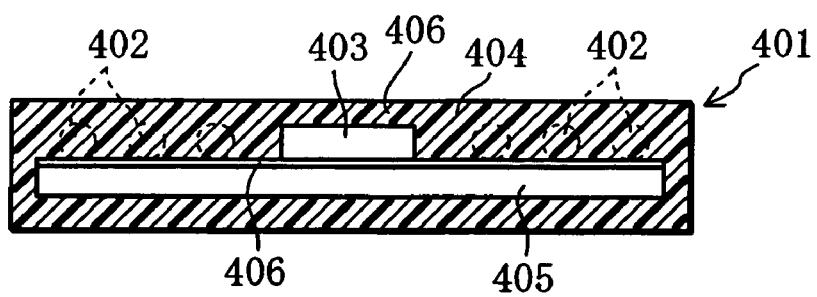
FIG. 18 is a cross-sectional view of the self light-emitting name plate shown in FIG. 17.
Figure 19:
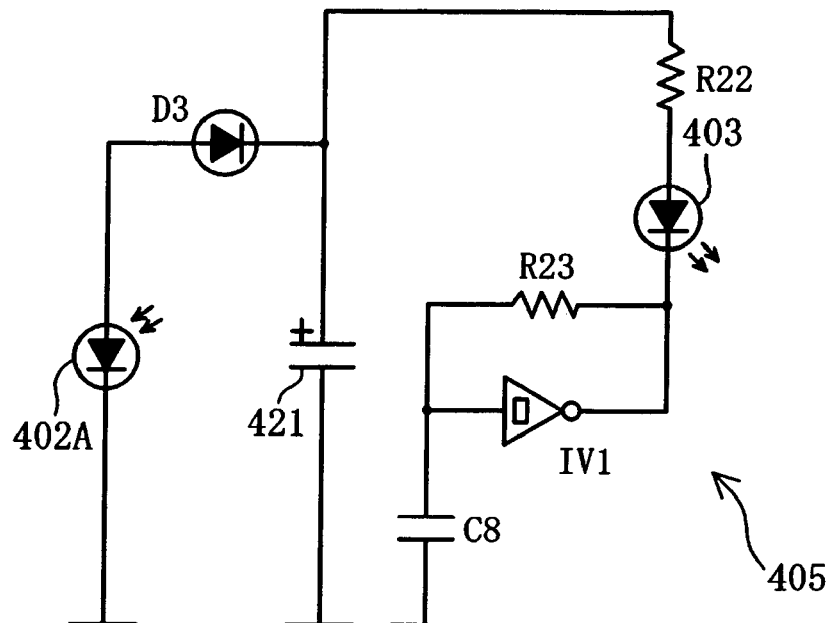
FIG. 19 is a circuit diagram of a light emitting control circuit of the self light-emitting name plate shown in FIG. 17.

Embodiment 5 (Refer to FIG. 17 through FIG. 19)

A self light-emitting device relating to Embodiment 5 is described next.

The present embodiment is an example where the present invention is applied to a self light-emitting name plate (equivalent to a self light-emitting device), where a white-color light emitting diode established on the name plate emits light due to a photo-electromotive force generated by multiple spherical photo-electric converting elements.

Spherical photo-electric converting elements 402 are similar to the spherical photo-electric converting elements 2 in Embodiment 1, so the detailed description is omitted, and only the different construction is described.

As shown in FIGS. 17 and 18, a self light-emitting name plate 401 is equipped with the twenty-one spherical photo-electric converting elements 402, a printed substrate 406, a white-color light emitting diode 403, a sealing member 404 and a light emitting control circuit 405.

Each converting element 402 has a positive electrode 413 and a negative electrode 414. The twenty-one converting elements 402 are arranged at even intervals to be along the inside of the external circumference of the upper surface of the rectangular printed substrate 406; the converting elements 402 are divided into three groups containing seven converting elements per group; the converting elements 402 in each group are connected by a copper wire in series; and the three series-connected bodies are connected by copper wires 419 in parallel.

The light emitting control circuit 405 is arranged on the rear surface of the substrate 406, and the printed substrate 406, the twenty-one converting elements 402, the light emitting diode 403 and the light emitting control circuit 405 are embedded in the sealing member 404 and they are integrally fixed, and this self light-emitting name plate 401 is constructed to be a thin rectangular plate as a whole.

As shown in FIG. 19, an electric double layer capacitor 421 (1 F of capacity) is established as a condenser where electric power is supplied from electric power generating device 402A having twenty-one converting elements 402 via a reverse-flow prevention diode D3. The light emitting control circuit 405 is equipped with a resistor R22, a schmitt trigger inverter IV1 connected to the white-color light emitting diode 403, a resistor R23 parallel-connected to this inverter, and a condenser C8 connected to the inverter IV1 and the resistor R23.

The inverter IV1 is an inverter where a threshold when shifting from the 'L' level to the 'H' level is established to be greater than a threshold when shifting from the 'H' level to the 'L' level, and it stably operates with fewer malfunctions.

An operation of the light emitting control circuit 405 is described next.

In the initial status, no electric charge is charged in the condenser C8, so the input terminal of the inverter IV1 is on the 'L' level, and the 'H' level signal is transmitted from the output terminal of the inverter IV1. As a result, the input and output terminals of the white-color light emitting diode 403 become the same electric potential, so the white-color light emitting diode 403 does not emit light. The 'H' level voltage transmitted from the output terminal of the inverter IV1 is charged in the condenser C8 via the resistor R23. When the electric potential of the input terminal of the inverter terminal IV1 ascends accompanied with the charging and reaches the threshold, the 'L' level signal is transmitted to the output terminal of the inverter IV1, and electric current flows into the output terminal of the inverter IV1 from the condenser C8 via the resistor R23, so the electric potential of the input terminal of the inverter IV1 descends and the diode 403 puts the light off.

Hereafter, similarly, the diode 403 repeats the lighting ON and OFF and operates blinking. The cycle of this repetition is determined depending upon the resistor R23 and the condenser C8, and the electric current and the intensity of the light emission are determined depending upon the resistor R22.

The next shows the results of a test, where the resistance values for the resistors and the capacity of the condenser arranged in this light emitting control circuit 405 are established as follows: R22=22 Ω, R23=220 kΩ and condenser C8=10 μF. The light emission could clearly be confirmed visually in the fine weather outside, and even after moving to a dark place three hours later, the blinking light emission continued for 3 hours.

Figure 20:
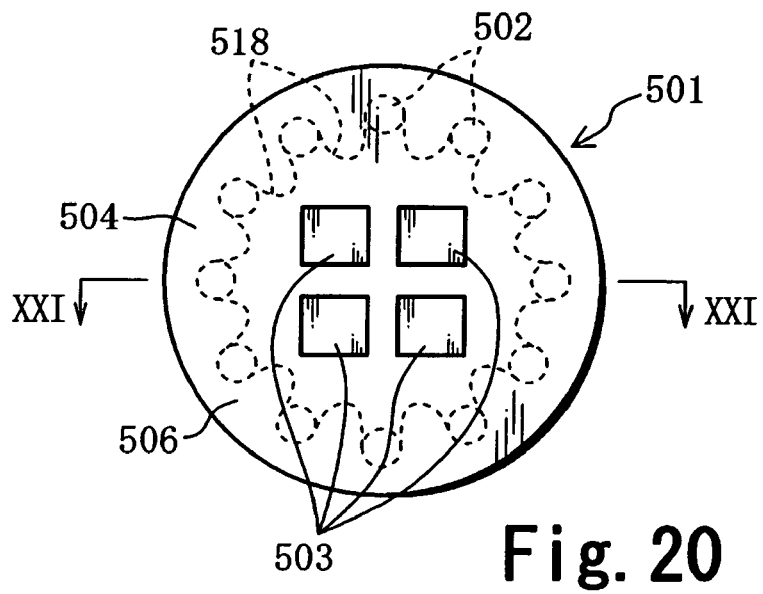
FIG. 20 is a plane view of a four-color self light-emitting device of the sixth embodiment.
Figure 21:
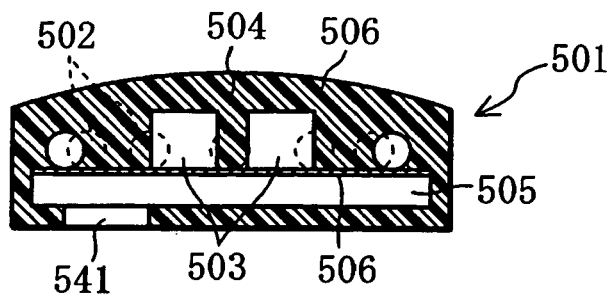
FIG. 21 is a cross-sectional view along XXI-XXI line in FIG. 20.
Figure 22:
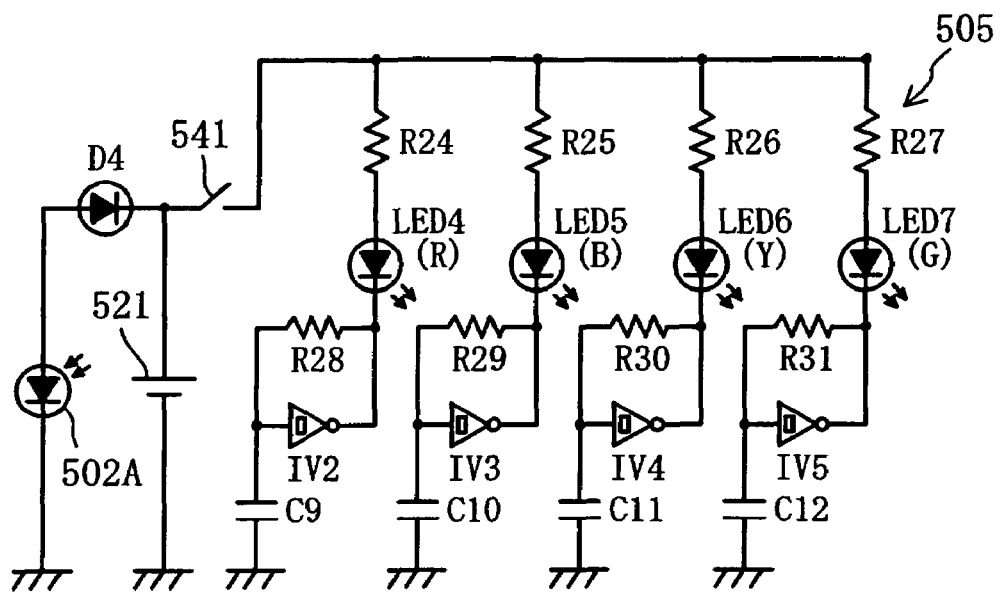
FIG. 22 is a circuit diagram of the self light-emitting control circuit of the four-color self light-emitting device shown in FIG. 20.

Embodiment 6 (Refer to FIG. 20 through FIG. 22)

A self light-emitting device relating to Embodiment 6 is described next.

The present embodiment is an example where the present invention is adopted to a four-color self light-emitting device, where electric power generated by twelve spherical photo-electric converting elements is charged in a secondary battery, and where four light emitting diodes with four different colors from each other emit light to blink using the electric power. Spherical photo-electric converting elements 502 are similar to the spherical photo-electric converting elements 2 in Embodiment 1, and for a light emitting control circuit 505, four control circuits, which are similar to the light emitting control circuit 405 in Embodiment 5, are arranged.

As shown in FIGS. 20 and 21, the four-color self light-emitting device 501 is equipped with the twelve converting elements 502, the four light emitting diodes 503 with different luminous color from each other, a printed substrate 506, a sealing member 504, the light emitting control circuit 505 and a switch 541 generally.

The sealing member 504 is formed from, for example, transparent epoxy resin, and it adheres to the whole elements, such as the twelve converting elements 502, the light emitting diodes 503, the printed substrate 506, the light emitting control circuit 505 and the switch 541, and they are integrated. The front surface side of the sealing member 504 is formed to be a convex lens and it functions as a lens.

The four light emitting diodes 503 indicate a red-color light emitting diode (R), a blue-color light emitting diode (B), a yellow-color light emitting diode (Y) and a green-color light emitting diode (G). These are arranged to be matrix with two rows and two columns in the center of the upper surface of the substrate 506 where the light emitting control circuit 505 is mounted. The twelve converting elements 502 are arranged in the vicinity of the external circumference on the circular substrate 506 at approximately 30° of intervals, and these converting elements 502 are connected in series by a copper wire 518, and they constitute electric power generating device 502A. The switch 541 is arranged in the vicinity of the lower end of the light emitting control circuit 505. A diode D4 for reverse-flow prevention, a manganese dioxide-lithium secondary battery 521, the switch 541 and the light emitting control circuit 505 are mounted on the rear surface of the substrate 506.

As shown in FIG. 22, four systems of light emitting controllers for the purpose of emitting a red-color light emitting diode LED4, a blue-color light emitting diode LED5, a yellow-color light emitting diode LED6 and a green-color light emitting diode LED7 are arranged in the light emitting control circuit 505.

Each light emitting controller is similar to the light emitting control circuit 405 in Embodiment 5, and the light emitting controller for the red-color light emitting diode LED4 has a resistor R24, a schmitt trigger inverter IV2, a resistor R28 connected to the inverter IV2 in parallel, and a condenser C9 connected to these inverter IV2 and resistor R28, and, it is operated in a manner similar to the light emitting control circuit 405 in Embodiment 5. Other three light emitting controllers also have similar construction, and they are similarly operated.

The electric power generated by the electric power generating device 502A is charged in the secondary battery 521, and when the switch 541 is turned ON, the electric power is supplied to a power supply input of the inverters IV2 through IV5 and the four light emitting controllers from the secondary battery 521, and the four light emitting diodes LED4 through LED7 with four different colors from each other emit light to blink.

The test results where the resistance values for the resistors and the capacity of the condensers are established as follows are explained next: R24=270 Ω, R25=22 Ω, R26=180 Ω, R27=56 Ω, R28=220 kΩ, R29=500 kΩ, R30=750 kΩ, R31=1 MΩ, and C9, C10, C11 and C12=10 μF. Charging outside during the day for 6 hours and light emission to blink during the night were repeated, and the light emission continued even after 1 month.

Figure 23:
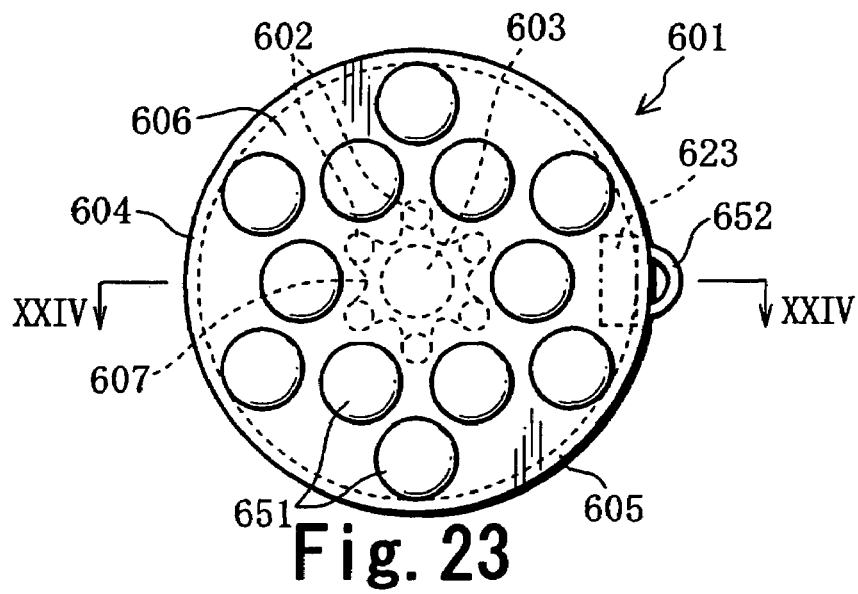
FIG. 23 is a plane view of a self light-emitting pendant of the seventh embodiment.
Figure 24:
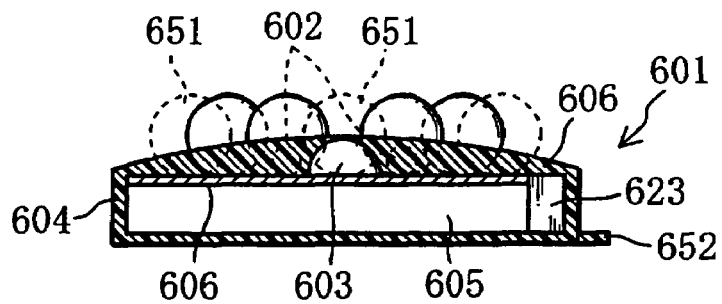
FIG. 24 is a cross-sectional view along XXIV-XXIV line in FIG. 23.

Embodiment 7 (FIG. 23 and FIG. 24)

Embodiment 7 is described next. The present embodiment is an example where the self light-emitting device of the present invention is adopted to a self light-emitting pendant. As shown in FIGS. 23 and 24, a self light-emitting pendant 601 is equipped with six spherical photo-electric converting elements 602, a light emitting diode 603, a circular printed substrate 606, a sealing member 604, a light emitting control circuit 605, a photo-detecting sensor 623, twelve beads 651 and a hook 652.

The spherical photo-electric converting elements 602 are similar to the spherical photo-electric converting elements 2 in Embodiment 1, and they are arranged on the printed substrate 606 and connected in series by a conducting wire 607. The light emitting diode 603 and the twelve beads 651 are also arranged on the printed substrate 606, and the light emitting control circuit 605 is mounted on the rear surface of the printed substrate 606.

The sealing member 604 is formed with transparent epoxy rein, and the six converting elements 602, the light emitting diode 603, the lower sides of the twelve beads 651, the light emitting control circuit 605 and the photo-detecting sensor 623 are buried into the sealing member 604, and the whole is integrated and fixed by the sealing member 604. The front surface of the sealing member 604 is formed to be a partial spherical convex and functions as a lens. The portions of the twelve beads 651 other than the lower sides are exposed to the outside of the front surface of the sealing member 604.

The beads 651 are formed with a slightly colored transparent synthetic resin, and function as a reflection member that can reflect light, respectively. The hook 652 is integrally formed with the sealing member 604, and it is provided on the lower part of the side of the self light-emitting pendant 601 in an extended condition.

The light emitting diode 603 is arranged in the center of the self light-emitting pendant 601, and the six converting elements 602 are arranged to form a circle around the periphery of the light emitting diode 603. The twelve beads 651 are arranged over the entire surface of the self light-emitting pendant 601, and they are arranged adjacent to the converting elements 602 and the light emitting diode 603.

The light emitting control circuit 605, for example, is a circuit, which is the same as that in FIG. 5 of Embodiment 1, and the photo-detecting sensor 623 has a cadmium sulfide (CdS) element. The light emitting control circuit 605 is for determining either the daytime or the night according to a detection signal of the photodetecing sensor 623; for charging the electric power generated by the six converting elements 602 during the day; and for allowing the light emitting diode 603 to emit light to blink only during the night. When light is received, the light reflected on the surfaces of the beads 651 reach the converting elements 602, and they contribute to the generation of electric power. When the light emitting diode 603 emits light, the light emitted from the light emitting diode 603 are diffusely reflected on the beads 651 and they shimmer beautifully.

The converting elements 602 are small but have a very similar configuration to the beads 651, respectively, so they also function as ornament along with the beads 651. The minute beads can be dispersed within the sealing member 604 on the surface side of the printed substrate 606, and in that case, more light can reach the six converting elements 602 due to scattering of light on the surfaces of the beads, and the power generation efficiency is enhanced. When the light emitting diode 603 emits light, the light emitted from there are scattered on the surfaces of the beads and shimmer beautifully.

If a chain or a string is tied to the hook 652, the self light-emitting device 601 can be utilized as a pendant, and if a setting or a pin for brooch is attached, it can be used as a brooch.

Next, this self light-emitting pendant 601 could fully charge an electrical double layer capacitor (2 F) in one hour with the fine weather outside, and it emitted light to blink for 3 hours during the night.

As described above, since the photo-detecting sensor 623 is provided, the light emission automatically starts at night. However, if a switch is established instead of the photo-detecting sensor 623, light can be emitted only when the switch is turned on. In addition, multiple light emitting diodes 603 with different luminance colors from each other are established, and light can be emitted only when the switch is turned on, as well.

Further, multiple light emitting diodes 603 with different luminance colors from each other are established, and the multiple light emitting diodes can blink by the light emitting control circuit 505 as in Embodiment 6. Not limiting to a brooch or a pendant, if it is miniaturized, it can be formed to be a strap for a cellar phone, a ring or a button, so various use applications can be expected in the illuminating accessories field.

Partially modified embodiments of the Embodiments 1 through 7 are described next.

1) In the embodiments, it is constructed such that the light emitting diode(s) blinks. However, it can be constructed that the light emitting diode(s) always emits light. When this construction, various constant current circuits and constant voltage circuits using various active elements including an IC for electric current control, an integrated circuit, such as an operational amplifier, a bipolar transistor, an FET and a diode, and passive elements, such as resistors, condensers or coils, can be applied. For these electronic components, normal electronic components for mounting on a substrate, including a dip type IC, can be used. However, from the points of miniaturization and light weight, it is desirable to use electronic components for mounting on a surface, including a surface mounting type IC, a chip resistor or a chip condenser. Further, a light emitting control circuit, a charge control circuit and a condenser can be established on a separate substrate, respectively. For example, the light emitting control circuit and the charge control circuit are arranged on one substrate, and only the condenser is separately arranged and it can be connected using a copper wire, generally. In particular, when applying a secondary battery as a condenser, when the secondary battery is deteriorated, only the secondary battery can be replaced, so the life of the self light-emitting device can be extended with a simple maintenance.

Figure 8:
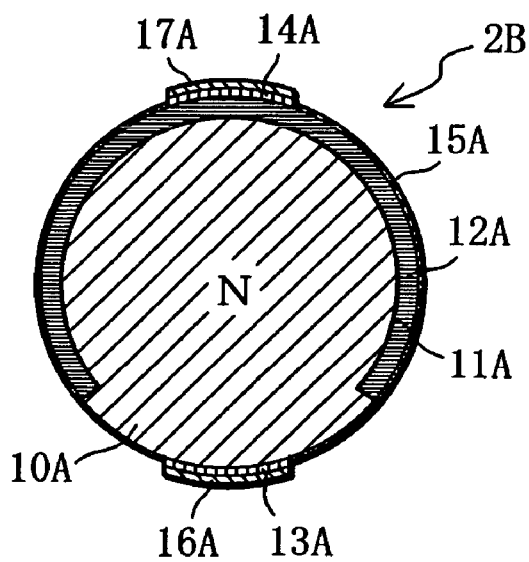
FIG. 8 is a cross-sectional view of a spherical photo-electric converting element relating to a modified embodiment.

2) In the embodiment, a p-type silicon semiconductor is used for the spherical crystal 10 and it comprises the spherical photo-electric converting elements 2. However, as shown in FIG. 8, the spherical photo-electric converting elements 2B can comprise the spherical crystal 10A formed with an n-type silicon semiconductor. This spherical photo-electric converting element 2B is equipped with a p-type diffusion layer 12A formed in the vicinity of the surface of the spherical crystal 10A for the purpose of forming the pn-joint 11A; a negative electrode 13A electrically connected to the n-type silicon of the spherical crystal; a positive electrode 14A formed at a position facing the negative electrode 13A relative to the center of the spherical crystal 10A; and an insulating coating 15A formed on the surface where the electrodes 13A and 14A are not formed. In addition, metal paste films 16A and 17A are coated over the surfaces of the negative electrode 13A and the positive electrode 14A, respectively.

3) In the embodiments, the spherical photo-electric converting elements are formed with silicon. However, the material is not limited to silicon, but a IV-group semiconductor, such as germanium, a III-V-group semiconductor or a II-VI-group semiconductor can form the spherical photo-electric converting elements.

4) In the embodiments, the light emitting diode is formed with an AlGaAs-base material. However, taking the visibility into consideration, another light emitting diode formed with an AlGaInP-base or AlGaInN-base material can be applied, and a resin-molded light emitting diode or a surface-mounted light emitting diode can be applied. In particular, when applying the resin-molded light emitting diode, a projection lens is not formed but the light emitting diode can be arranged in an exposed manner. In addition, when constructing like this, the construction where the light emitting diode is detachable enables mounting of any desired color light emitting diode by a user, so fanciness can be improved. In addition, any light source other than a light emitting diode can be applied. However, it is desirable to apply a luminous body where light emission at a high luminance can be obtained with a small electric current.

5) A reflection film generally can be formed around a light emitting diode. This construction enables the transmission of the light from the light emitting diode reflecting outward, so the visibility from the outside during the night can be improved.

6) In the embodiments, the sealing member including the lens members is formed with epoxy resin. However, it can be formed with a material that can transmit a light with pre-determined wavelength through, where the spherical photo-electric converting elements can generate electric power, such as silicon resin, acrylic resin, polycarbonate resin, fluorine resin, polyimide resin, polyvinyl resin, ethylenevinyl acetate resin, naphtlane rein, or cellulose acetate. For example, forming with a synthetic rein having flexibility enables the shape change of a self light-emitting device, and the structure can be very strong against any impact from the outside. Further, mixing a dispersing agent into a synthetic resin also enables the improvement of uniformity of the light emission.

7) In the embodiments, the lens members and the sealing member are integrally formed with epoxy resin. However, the lens members and the sealing member can be separately manufactured, and each of them can be adhered using an adhesive. When this construction, forming the lens members and the sealing member with the same material enables the enhancement of the strength of the adhesion by an adhesive.

In the meantime, the lens members and the sealing member can be formed with different materials. When this construction, as long as a condenser lens member can transmit a light with pre-determined wavelength through, where the spherical photo-electric converting elements can generate electric power, it is acceptable, and the materials to form a projection lens and a sealing member are not especially limited. For example, the material for the projection lens member can be colored, and containing of a fluorescent substance or a phosphorescent substance enables the provision of a self light-emitting device that excels in the fanciness. Further, the sealing member can be formed with a resin with plasticity, such as polyolefin resin, polyamide resin, polypropylene resin, polyester resin, vinyl chloride resin or urethane resin.

8) The configuration of the condenser lens member is appropriately modifiable, such as hemispheric or flat. When changing the configuration of the condenser lens, it is desirable that a portion of the spherical photo-electric converting element is positioned lower than the condenser lens. This construction results in the improvement of the power generation efficacy relative to incident light from right above; concurrently, it enables the maintenance of constant light emission efficacy relative to incident light from an inclined direction, as well. Further, it can be constructed such that a reflector film is established onto the condenser lens member so as to guide light to the spherical photo-electric converting elements.

9) As a condenser, various secondary batteries including a manganese-lithium secondary battery, a lithium-ion battery, a nickel-hydrogen battery and a nickel-cadmium battery, and a capacitor with comparatively great capacity, such as an electric double layer capacitor, can be applied. When considering the miniaturization and light weight of the entire device, it is desirable to use a coin type manganese-lithium secondary battery or an electric double layer capacitor. However, taking the deterioration due to the repetitive charge or discharge into consideration, it is desirable to apply a capacitor, such as an electric double layer capacitor, rather than a secondary battery.

10) As a photo-detecting sensor, various sensors, typically a photo-electric converting element, such as photodiode where an output voltage or electric current changes depending upon the quantity of received light, can be used. In addition, a spherical photo-electric converting elements can be established as a photo-detecting sensor. This construction enables the additional improvement from the aspects of miniaturization and light weight and the reduction of production cost.

11) The number of the spherical photo-electric converting elements and the light emitting diodes arranged in the self light-emitting device is appropriately modifiable. It is desirable that the number of the spherical photo-electric converting elements is determined by taking the desired power generation and light condensing rate of a condenser lens generally into consideration. Further, the arrangement of the spherical photo-electric converting elements and the light emitting diodes is not particularly limited to the ones in the embodiments, but the spherical photo-electric converting elements can be linearly arranged or arranged with multiple lines and rows.

12) A reflector film can be formed on a lower side of the spherical photo-electric converting elements. With this formation, light, which is not received by the spherical photo-electric converting elements, can be reflected to the spherical photo-electric converting elements, so it enables the enhancement of the light emission efficacy.

13) The configuration of the self light-emitting device can be variously formed, such as circular, rectangular or star-shaped according to a planar view.

The present invention is not limited to the described embodiments, and a person of ordinary skill in the field of this technology pertaining to the present invention can add various modifications to the embodiments within the scope of the present invention and implement them, and the present invention includes these modified embodiments.

What is claimed is:

1. A light emitting device comprising:
spherical photo-electric converting elements each comprising:
a spherical crystal formed of one of p type semiconductor and n type semiconductor material;
a diffusion layer formed adjacent a surface of the spherical crystal;
a pn junction formed by said diffusion layer in the spherical crystal;
first and second electrodes connected to opposing sides of the pn junction and respectively disposed on opposing top and bottom sides of said spherical crystal with a center of said spherical crystal disposed substantially between the first and second electrodes; and
a substantially spherical light receiving surface;
semispherical lens members for directing light to the spherical photo-electric converting elements;
partial-spherical metallic reflection members disposed below the spherical photo-electric converting elements and configured to reflect light incident on the partial-spherical metallic reflection members to a lower surface of said spherical photo-electric converting elements, each of said partial-spherical metallic reflection members being configured to function as a lead frame and being connected to the second electrode of a corresponding one of said spherical photo-electric converting elements disposed above said partial-spherical metallic reflection member;
a luminous device for emitting light using power from said spherical photo-electric converting elements;
a synthetic resin member integrally formed with the lens members and embedding the spherical photo-electric converting elements, the luminous device, and the partial-spherical metallic reflection members; and
said spherical photo-electric converting elements being connected in series by said first electrodes of each of said spherical photo-electric converting elements, with exception of a last one of said spherical photo-electric converting elements in the series, being connected to one of the partial-spherical metallic reflection members disposed below an adjacent one of said spherical photo-electric converting elements in the series.

2. The light emitting device according to claim 1 wherein said second electrodes are connected to the partial-spherical metallic reflection members by a conductive bonding material.

3. The light emitting device according to claim 2 wherein said luminous device has a first electrode bonded to by conductive material to an extension of one of said partial-spherical metallic reflection members corresponding to said last one of said spherical photo-electric converting elements in the series, and said luminous device has a second electrode electrically connected to a first electrode of a first one of said spherical photo-electric converting elements in the series.

4. A light-emitting device, comprising:
spherical photo-electric converting elements connected in series and each having a substantially spherical light receiving surface;
a lens member for guiding or condensing light to said spherical photo-electric converting element;
a condenser for accumulating electric power generated by said spherical photo-electric converting elements;
luminous bodies for emitting light and powered by said photo-electric converting elements;
a light emitting control circuit for controlling a conduction of electric power to said luminous bodies;
a photo-detecting sensor incorporated into said light emitting control circuit, said photo-detecting sensor having an ultraviolet sensor and a direct-current amplifying circuit amplifying a voltage corresponding to an intensity of ultraviolet rays detected by said ultraviolet sensor and transmitting the amplified voltage in said light emitting control circuit, and said light emitting control circuit selectively driving said luminous bodies to emit light based upon the amplified voltage as an output of said ultraviolet sensor; and
a sealing member for enclosing the light emitting device into an integral unit.

5. The self light-emitting device according to claim 4, wherein, said lens member and said sealing member are formed with the same type of synthetic resin material.

6. The light-emitting device according to claim 4, wherein, a reflection member is formed from a transparent resin material having a reflective surface that is provided adjacent to said spherical photo-electric converting elements and said luminous bodies.

7. The light-emitting device according to claim 4, wherein said light emitting control circuit selectively drives one of said luminous bodies at a time to emit light based upon the output of said ultraviolet sensor so as to indicate a range of the intensity of ultraviolet rays detected by said ultraviolet sensor.

8. A light-emitting device, comprising:
spherical photo-electric converting elements connected in series and each having a substantially spherical light receiving surface;
a condenser for accumulating electric power generated by said spherical photo-electric converting elements;
luminous bodies for emitting light and powered by said photo-electric converting elements;
a light emitting control circuit for controlling a conduction of electric power to said luminous bodies;
a photo-detecting sensor incorporated into said light emitting control circuit, said photo-detecting sensor having a light sensor and an amplifying circuit to amplify an output of the light sensor to reflect an intensity of light rays detected by said light sensor and transmit the amplified output in said light emitting control circuit;
said light emitting control circuit selectively driving said luminous bodies to emit light based upon the amplified output of said light sensor; and
a sealing member for enclosing the light emitting device into an integral unit.

9. The light-emitting device according to claim 8, wherein said light sensor is an ultraviolet light sensor.

10. The light-emitting device according to claim 8, wherein a reflection member is formed from a transparent resin material having a reflective surface that is provided adjacent to said spherical photo-electric converting elements and said luminous bodies.

11. The light-emitting device according to claim 10, wherein said light sensor is an ultraviolet light sensor.

* * * * *